(12) United States Patent
Inoue et al.

(10) Patent No.: US 8,587,022 B2
(45) Date of Patent: Nov. 19, 2013

(54) NITRIDE SEMICONDUCTOR LIGHT-EMITTING ELEMENT AND PROCESS FOR PRODUCTION THEREOF

(75) Inventors: Akira Inoue, Osaka (JP); Junko Iwanaga, Osaka (JP); Ryou Kato, Osaka (JP); Masaki Fujikane, Osaka (JP); Toshiya Yokogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 315 days.

(21) Appl. No.: 13/256,061

(22) PCT Filed: Dec. 27, 2010

(86) PCT No.: PCT/JP2010/007561
§ 371 (c)(1),
(2), (4) Date: Sep. 12, 2011

(87) PCT Pub. No.: WO2011/083551
PCT Pub. Date: Jul. 14, 2011

(65) Prior Publication Data
US 2012/0001223 A1    Jan. 5, 2012

(30) Foreign Application Priority Data
Jan. 6, 2010 (JP) .................. 2010-001438

(51) Int. Cl.
*H01L 33/00* (2010.01)
(52) U.S. Cl.
USPC .................. 257/101; 257/103; 257/E33.003; 257/E33.025; 257/E33.043
(58) Field of Classification Search
USPC .................. 257/101, 103, E33.003, E33.025, 257/E33.043
See application file for complete search history.

(56) References Cited

U.S. PATENT DOCUMENTS

| | | |
|---|---|---|
| 5,733,796 A | 3/1998 | Manabe et al. |
| 2005/0161679 A1 | 7/2005 | Sun |
| 2006/0192207 A1 | 8/2006 | Wook Shim et al. |
| 2006/0261367 A1 | 11/2006 | Lee et al. |
| 2007/0194328 A1 | 8/2007 | Komada |
| 2008/0191195 A1 | 8/2008 | Tanizawa et al. |
| 2008/0251781 A1 | 10/2008 | Han et al. |
| 2009/0085054 A1 | 4/2009 | Jeon et al. |
| 2009/0085057 A1 | 4/2009 | Park et al. |

(Continued)

FOREIGN PATENT DOCUMENTS

| | | |
|---|---|---|
| JP | 06-291367 A | 10/1994 |
| JP | 09-092880 A | 4/1997 |

(Continued)

OTHER PUBLICATIONS

International Search Report for corresponding International Application No. PCT/JP2010/007561 mailed Mar. 1, 2011.

*Primary Examiner* — Daniel Luke
(74) *Attorney, Agent, or Firm* — Renner, Otto, Boisselle & Sklar, LLP

(57) ABSTRACT

A nitride-based semiconductor light-emitting device 31 includes: an n-type GaN substrate 1 which has an m-plane principal surface; a current diffusing layer 7 provided on the n-type GaN substrate 1; an n-type nitride semiconductor layer 2 provided on the current diffusing layer 7; an active layer 3 provided on the n-type nitride semiconductor layer 2; a p-type nitride semiconductor layer 4 provided on the active layer 3; a p-electrode 5 which is in contact with the p-type nitride semiconductor layer 4; and an n-electrode 6 which is in contact with the n-type GaN substrate 1 or the n-type nitride semiconductor layer 2. The donor impurity concentration of the n-type nitride semiconductor layer 2 is not more than $5 \times 10^{18}$ cm$^{-3}$, and the donor impurity concentration of the current diffusing layer 7 is ten or more times the donor impurity concentration of the n-type nitride semiconductor layer 2.

25 Claims, 15 Drawing Sheets

(56) References Cited

U.S. PATENT DOCUMENTS

| | | |
|---|---|---|
| 2010/0207136 A1 | 8/2010 | Armitage et al. |
| 2010/0230690 A1 | 9/2010 | Kyono et al. |
| 2010/0240162 A1 | 9/2010 | Bae |

FOREIGN PATENT DOCUMENTS

| | | |
|---|---|---|
| JP | 2000-286451 A | 10/2000 |
| JP | 2001-345476 A | 12/2001 |
| JP | 2004-304090 A | 10/2004 |
| JP | 2005-217406 A | 8/2005 |
| JP | 2005-276899 A | 10/2005 |
| JP | 2007-221056 A | 8/2007 |
| JP | 2008-236300 A | 10/2008 |
| JP | 2008-270805 A | 11/2008 |
| JP | 2009-088506 A | 4/2009 |
| JP | 4375497 | 9/2009 |
| WO | 2008/047907 A1 | 4/2008 |
| WO | 2008/069482 A1 | 6/2008 |

(a)

(b)

NITRIDE SEMICONDUCTOR LIGHT-EMITTING ELEMENT AND PROCESS FOR PRODUCTION THEREOF

TECHNICAL FIELD

The present invention relates to a nitride-based semiconductor device formed on an n-type GaN substrate (or GaN layer) which has an m-plane principal surface and to a fabrication method thereof. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors which contain Ga as a Group III element (which will be referred to herein as "GaN-based semiconductors" and which are represented by the formula $Al_xGa_yIn_zN$ (where $0 \le x, y, z \le 1$ and $x+y+z=1$)) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \le x, y, z \le 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". As for the classification of the "c-plane", a c-plane which is terminated with a Group III element, such as Ga, is called either a "+c-plane" or a "(0001) plane", and a c-plane which is terminated with a Group V element, such as nitrogen, is called either a "−c-plane" or a "(000-1) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, Ga atoms and nitrogen atoms are not present in the same atomic plane, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer. Consequently, the internal quantum yield decreases due to the quantum confinement Stark effect of carriers, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" (m-plane GaN-based substrate) be used. As used herein, "−" attached on the left-hand side of a Miller-Bravais index in the parentheses means a "bar" (a negative direction index). As shown in FIG. 2, the m-plane is parallel to the c-axis (i.e., the primitive vector c) and intersects with the c-plane at right angles. On the m-plane, Ga atoms and nitrogen atoms are on the same atomic plane. For that reason, no spontaneous polarization will be produced perpendicularly to the m-plane. That is why if a semiconductor multilayer structure is formed perpendicularly to the m-plane, no piezoelectric field will be generated in the active layer, thus overcoming the problems described above. The "m-plane" is a generic term that collectively refers to a family of planes including (10-10), (−1010), (1-100), (−1100), (01-10) and (0-110) planes.

Also, as used herein, the "X-plane growth" means epitaxial growth that is produced perpendicularly to the X plane (where X=c or m) of a hexagonal wurtzite structure. As for the X-plane growth, the X plane will be referred to herein as a "growing plane". A layer of semiconductor crystals that have been formed as a result of the X-plane growth will be referred to herein as an "X-plane semiconductor layer".

The light-emitting device which is fabricated using a nitride semiconductor can be classified into two device types, the first device type where the p-electrode and the n-electrode are arranged on the same crystal growth surface side (horizontal type) and the second device type where the p-electrode and the n-electrode are vertically arranged so as to sandwich a nitride semiconductor layer (vertical type), irrespective of whether c-plane or m-plane is used for the principal surface. The horizontal type can be further classified into the horizontal face-up type where light goes out from the p-type nitride semiconductor layer side and the horizontal face-down type where light goes out from the n-type nitride semiconductor layer side.

In the case of the horizontal type, the p-electrode and the n-electrode are largely horizontally separated from each other. Therefore, the current concentrates in an area where the space between the p-electrode and the n-electrode is smallest, so that uniform current injection into the active layer is difficult. Due to this electric field concentration, the breakdown voltage of the light-emitting device disadvantageously decreases.

On the other hand, the vertical type is also referred to as "attached type". In the vertical type nitride-based semiconductor light-emitting device, light goes out from the n-type nitride semiconductor layer side while the p-type nitride semiconductor layer side is attached onto a conductive substrate. In the case of the vertical type, the n-electrode blocks light, and therefore, the n-electrode should be as small as possible. In the n-type nitride semiconductor layer, electrons are locally injected at a position which is in contact with the n-electrode. Therefore, if electrons do not sufficiently diffuse in the n-type nitride semiconductor layer, uniform current injection in the active layer will be difficult. To realize uniform current injection in the active layer, a configuration where a transparent electrode is used as the n-electrode has already been put to practical use. However, this configuration causes another problem that light is absorbed by the transparent electrode.

As described above, either of the horizontal type structure and the vertical type structure has a disadvantage that, without sufficient horizontal diffusion of electrons in the n-type nitride semiconductor layer, the current-voltage characteristic would deteriorate (i.e., the operating voltage would increase).

Usually, horizontal diffusion of electrons is realized by increasing the donor impurity concentration of the n-type nitride semiconductor layer. However, in the n-type nitride semiconductor layer formed on the c-plane according to the prior art, if the impurity concentration is increased to a high value which is, for example, higher than $1\times10^{19}$ cm$^{-3}$, the crystallinity disadvantageously deteriorates (see, for example, Patent Document 1). Therefore, in many of the nitride-based semiconductor light-emitting devices which have already been put to practical use, the impurity concentration of the n-type nitride semiconductor layer is not more than $5\times10^{18}$ cm$^{-3}$.

To realize a low forward voltage (Vf) and a high emission power, Patent Document 2 proposes a configuration where the n-type nitride semiconductor layer is formed by multiple n-type GaN layers of different impurity concentrations. Since Patent Document 2 describes using a c-plane sapphire substrate, the principal surface of the n-type nitride semiconductor layer is probably a c-plane surface.

FIG. 3 is a cross-sectional view showing a prior art nitride-based semiconductor light-emitting device disclosed in Patent Document 2. In the nitride-based semiconductor light-emitting device shown in FIG. 3, a buffer layer 102, an n-type GaN underlayer 103, an n-type contact layer 104, an active layer 105, a p-type cladding layer 106, and a p-type contact layer 107 are provided on a substrate 101. An n-side pad electrode 109 is provided so as to be in contact with the n-type contact layer 104. A transparent electrode 108 is provided so as to be in contact with the p-type contact layer 107. A p-side pad electrode 110 is provided so as to be in contact with the transparent electrode 108. Between the n-type contact layer 104 and the active layer 105, a multi-film nitride semiconductor layer 111 is interposed so as to be in contact with the active layer 105. The multi-film nitride semiconductor layer 111 is a multilayer film formed by two or more repetitions of a multilayer structure consisting of the first nitride semiconductor layer 111a and the second nitride semiconductor layer 111b. The first nitride semiconductor layer 111a is a layer which contains an n-type impurity. The second nitride semiconductor layer 111b is a layer which contains an n-type impurity at a concentration lower than the first nitride semiconductor layer 111a, or an undoped layer. Patent Document 2 discloses that the emission power can be improved while a low forward voltage (Vf) is maintained. Although details of the reasons why the emission power improves are not clear from Patent Document 2, an estimated reason is that the efficiency of carriers injected into the active layer improves.

To provide an n-type nitride semiconductor layer of a high doping concentration and high crystallinity, Patent Document 3 proposes a multilayer structure that includes a plurality of n-type GaN layers which have doping concentrations exceeding $1\times10^{19}$ cm$^{-3}$ and a plurality of undoped GaN layers which have thicknesses of 30 nm or more. Patent Document 3 fails to describe the plane orientation of the principal surface of the n-type nitride semiconductor layer.

FIG. 4 is a cross-sectional view showing a prior art nitride-based semiconductor light-emitting device disclosed in Patent Document 3. In the nitride-based semiconductor light-emitting device shown in FIG. 4, a buffer layer 202, an n-type nitride semiconductor layer 203, an active layer 204, and a p-type nitride semiconductor layer 205 are provided on a substrate 201. An n-electrode 208 is provided so as to be in contact with the n-type nitride semiconductor layer 203. A p-electrode 206 is provided so as to be in contact with the p-type nitride semiconductor layer 205. A p-side bonding pad 207 is provided on the p-electrode 206. The n-type nitride semiconductor layer 203 includes a multilayer structure which is formed by a plurality of n-type GaN layers 203a and a plurality of un-GaN layers 203b. In the configuration of Patent Document 3 where a plurality of undoped GaN layers which have thicknesses of 30 nm or more are provided, the crystallinity of the n-type semiconductor layer which has been once degraded due to a high impurity concentration can be recovered.

Patent Document 4 discloses a "heavily doped layer" but fails to describe an n-type GaN substrate. Patent Document 4 also fails to describe the crystallinity of a current diffusing layer that is formed on an n-type GaN substrate so as to be in contact with the n-type GaN substrate or the crystallinity of a semiconductor multilayer structure formed on the current diffusing layer.

CITATION LIST

Patent Literature

Patent Document 1: U.S. Pat. No. 5,733,796
Patent Document 2: Japanese Laid-Open Patent Publication No. 2007-221056
Patent Document 3: Japanese Laid-Open Patent Publication No. 2009-088506
Patent Document 4: Japanese Laid-Open Patent Publication No. 2005-217406
Patent Document 5: Japanese Laid-Open Patent Publication No. 2008-270805
Patent Document 6: Japanese Patent No. 4375497

SUMMARY OF INVENTION

Technical Problem

In the configurations described in Patent Documents 2 and 3 where the semiconductor multilayer structures are used, it is necessary to accurately control the thickness and the impurity concentration of each layer of the multilayer structure. This causes a new problem that the manufacturing management is difficult.

In contrast to a GaN substrate which has a c-plane principal surface, an n-type GaN substrate which has an m-plane principal surface has difficulty in increasing the n-type impurity concentration. Therefore, in the case where an n-type GaN substrate which has an m-plane principal surface is used, the probability of horizontal diffusion of electrons in the GaN substrate portion further decreases, and accordingly, the problem of deterioration of the current-voltage characteristic becomes more serious.

The present invention was conceived for the purpose of solving the above problems. One of the major objects of the present invention is to provide a semiconductor light-emitting device in which uniform current injection into the active layer can be realized without deteriorating the crystallinity of the n-type semiconductor layer.

Solution to Problem

A nitride-based semiconductor light-emitting device of the present invention includes: an n-type GaN substrate which has an m-plane principal surface; a current diffusing layer provided on the n-type GaN substrate, the current diffusing layer being in contact with the n-type GaN substrate; an n-type nitride semiconductor layer provided directly or indirectly on the current diffusing layer; an active layer provided directly or indirectly on the n-type nitride semiconductor layer; a p-type nitride semiconductor layer provided directly or indirectly on the active layer; a p-electrode which is in contact with the p-type nitride semiconductor layer; and an n-electrode which is in contact with the n-type GaN substrate or the n-type nitride semiconductor layer, wherein a donor impurity concentration of the n-type nitride semiconductor layer is not more than $5 \times 10^{18}$ cm$^{-3}$, and a donor impurity concentration of the current diffusing layer is ten or more times the donor impurity concentration of the n-type nitride semiconductor layer.

In one embodiment, the donor impurity concentration of the current diffusing layer is ten or more times a donor impurity concentration of the n-type GaN substrate.

In one embodiment, the donor impurity concentration of the current diffusing layer is not less than $5 \times 10^{18}$ cm$^{-3}$ and not more than $5 \times 10^{19}$ cm$^{-3}$.

In one embodiment, the donor impurity concentration of the n-type GaN substrate is not more than $5 \times 10^{18}$ cm$^{-3}$.

In one embodiment, a thickness of the current diffusing layer is not less than 25 nm and not more than 2 µm.

In one embodiment, a donor impurity of the current diffusing layer is silicon.

In one embodiment, the current diffusing layer is further doped with oxygen as an additional donor impurity.

In one embodiment, the donor impurity concentration of the current diffusing layer is not less than $1 \times 10^{19}$ cm$^{-3}$.

In one embodiment, part of a semiconductor multilayer structure which is formed by the current diffusing layer, the n-type nitride semiconductor layer, the active layer, and the p-type nitride semiconductor layer has a recessed portion, and the p-type nitride semiconductor layer and the active layer are exposed at a lateral surface of the recessed portion, the n-type nitride semiconductor layer is exposed at an upper surface of the recessed portion, and the n-electrode is provided on the n-type nitride semiconductor layer.

In one embodiment, the n-electrode is provided on a surface of the n-type GaN substrate opposite to the other surface that is in contact with the current diffusing layer.

In one embodiment, the thickness of the current diffusing layer is not less than 25 nm and not more than 400 nm.

Another nitride-based semiconductor light-emitting device of the present invention includes: an n-type GaN substrate; a current diffusing layer provided on the n-type GaN substrate, the current diffusing layer being in contact with the n-type GaN substrate; an n-type nitride semiconductor layer provided directly or indirectly on the current diffusing layer; an active layer provided directly or indirectly on the n-type nitride semiconductor layer; a p-type nitride semiconductor layer provided directly or indirectly on the active layer; a p-electrode which is in contact with the p-type nitride semiconductor layer; and an n-electrode which is in contact with the n-type GaN substrate or the n-type nitride semiconductor layer, wherein a donor impurity concentration of the n-type nitride semiconductor layer is not more than $5 \times 10^{18}$ cm$^{-3}$, a donor impurity concentration of the current diffusing layer is ten or more times the donor impurity concentration of the n-type nitride semiconductor layer, and an angle between a normal to a principal surface of the n-type GaN substrate and a normal to an m-plane is not less than 1° and not more than 5°.

In one embodiment, the n-type GaN substrate is a semiconductor layer which is inclined in a c-axis direction or an a-axis direction.

In one embodiment, the current diffusing layer is formed by increasing a substrate temperature while supplying a source gas.

Advantageous Effects of Invention

According to the present invention, horizontal diffusion of a current is enabled by provision of the current diffusing layer between the n-type GaN substrate which has an m-plane principal surface and the n-type nitride semiconductor layer. As a result, a current is uniformly injected throughout the active layer via the n-type nitride semiconductor layer. Thus, a nitride-based semiconductor light-emitting device can be realized which has an improved current-voltage characteristic and a high power conversion efficiency so that the optical power is large even at a low voltage. Further, a nitride-based semiconductor light-emitting device which is capable of uniform emission can be realized.

Further, the concentration of an electric field in an area where the space between the p-electrode and the n-electrode is smallest decreases. Therefore, a nitride-based semiconductor light-emitting device of excellent breakdown voltage characteristic can be realized.

According to the present invention, the donor impurity concentration of the current diffusing layer exhibits a high value which is ten or more times the donor impurity concentration of the n-type nitride semiconductor layer. Since the surface of the current diffusing layer is the m-plane, deterioration of the crystallinity of the current diffusing layer does not readily occur, even when the impurity concentration of the current diffusing layer is high, in comparison to the c-plane surface. Therefore, the crystallinity of a semiconductor layer formed on the current diffusing layer, e.g., the n-type nitride semiconductor layer, is also maintained high.

In general, in the case of an m-plane semiconductor layer, it is difficult to increase the n-type impurity concentration in comparison to a c-plane semiconductor layer. However, according to the present invention, the n-type impurity concentration of the current diffusing layer can be increased according to a simple method.

The same effects are achieved even when the principal surface of a GaN substrate used is a surface inclined from the m-plane by an angle of 1° or more.

DESCRIPTION OF EMBODIMENTS (Embodiments)

Hereinafter, embodiments of a nitride-based semiconductor light-emitting device of the present invention will be described with reference to the drawings.

Figure 5:
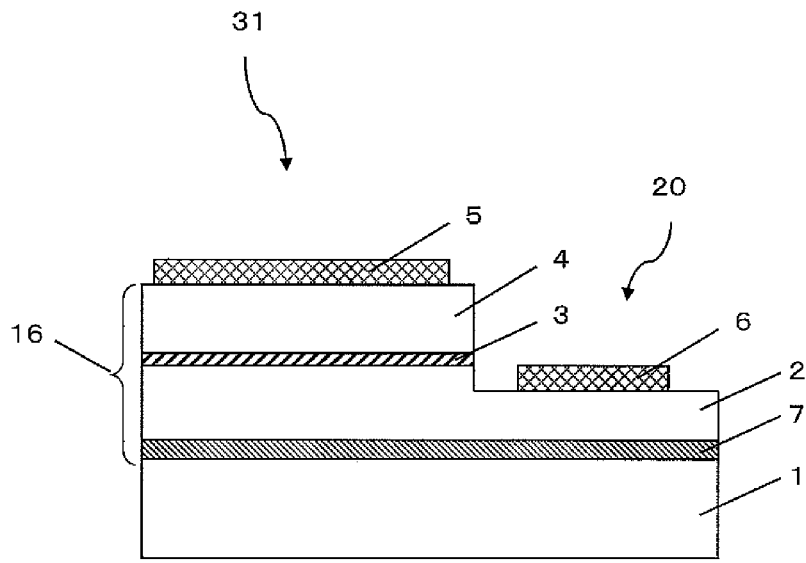
FIG. 5 is a cross-sectional view showing a structure of a nitride-based semiconductor light-emitting device 31 which is an embodiment of the present invention.

FIG. 5 is a cross-sectional view showing a structure of a nitride-based semiconductor light-emitting device 31 of the present embodiment. The nitride-based semiconductor light-emitting device 31 has a configuration where a p-electrode 5 and an n-electrode 6 are provided on the same crystal growth surface side (surface electrode type).

As shown in FIG. 5, the nitride-based semiconductor light-emitting device 31 of the present embodiment includes an n-type GaN substrate (or GaN layer) 1, which has an m-plane principal surface, and a semiconductor multilayer structure 16 provided on the n-type GaN substrate (or GaN layer) 1. The semiconductor multilayer structure 16 includes a current diffusing layer 7, an n-type nitride semiconductor layer 2 provided directly or indirectly on the current diffusing layer 7, an active region 3 provided directly or indirectly on the n-type nitride semiconductor layer 2, and a p-type nitride semiconductor layer 4 provided directly or indirectly on the active region 3.

The p-electrode 5 is in contact with the p-type nitride semiconductor layer 4. On the other hand, the n-type nitride semiconductor layer 2 is in contact with the n-electrode 6.

In the present embodiment, the donor impurity concentration of the n-type nitride semiconductor layer 2 is not more than $5 \times 10^{18}$ cm$^{-3}$. At the same time, the donor impurity concentration of the current diffusing layer 7 is ten or more times the donor impurity concentration of the n-type nitride semiconductor layer 2.

In the present embodiment, the current diffusing layer 7 is interposed between the n-type GaN substrate (or GaN layer) 1 that has an m-plane principal surface and the n-type nitride semiconductor layer 2, whereby horizontal diffusion of a current is enabled. This allows the current to be injected uniformly throughout the active layer 3 via the n-type nitride semiconductor layer 2. Thus, the current-voltage characteristic is improved, so that a large optical power can be obtained even at a low voltage, and the power conversion efficiency can be increased. Also, uniform emission can be realized.

Further, the concentration of an electric field in an area where the space between the p-electrode 5 and the n-electrode 6 is smallest decreases. Therefore, the breakdown voltage characteristic can be improved.

In this specification, the "donor impurity concentration" means the average concentration of a donor impurity throughout the entire layer. Therefore, even when the concentration of the impurity in the current diffusing layer 7 is locally lower than ten times the impurity concentration of the n-type nitride semiconductor layer 2, the effects of the present invention will be achieved so long as the average concentration of the electron diffusing layer 7 is ten or more times the average concentration of the n-type nitride semiconductor layer 2.

Here, specifically, the "average concentration of the current diffusing layer 7" may be calculated by dividing the total amount of the donor impurity distributed throughout the entire current diffusing layer 7 (unit: atom) by the volume of the current diffusing layer 7. The amount of the donor impurity distributed throughout the entire current diffusing layer 7 can be obtained by SIMS analysis. The volume of the current diffusing layer 7 is obtained by multiplying the thickness of the current diffusing layer 7 by the area of a region which is to be subjected to sputtering. Here, the thickness of the current diffusing layer 7 is defined by the Full Width at Half Maximum (FWHM) of the impurity profile obtained by SIMS analysis. The area of a region which is to be subjected to sputtering in SIMS analysis is determined depending on the setups of a SIMS analyzer. Likewise, the "average concentration of the n-type nitride semiconductor layer 2" can be calculated by dividing the total amount of the donor impurity distributed throughout the n-type nitride semiconductor layer 2 (unit: atom) by the volume of the n-type nitride semiconductor layer 2.

In the present embodiment, silicon is distributed as the donor in the n-type GaN substrate 1, the current diffusing layer 7, and the n-type nitride semiconductor layer 2. In the present embodiment, the "donor impurity concentration" refers to the concentration of silicon. Note that the donor may be oxygen instead of silicon. In that case, the "donor impurity concentration" refers to the total concentration of silicon and oxygen.

In FIG. 5, in a region of the semiconductor multilayer structure 16 on which the n-electrode 6 is to be formed, there is a recessed portion 20 such that part of the n-type nitride semiconductor layer 2 is exposed. At the lateral surface of the recessed portion 20, the p-type nitride semiconductor layer 4 and the active layer 3 are exposed. The n-electrode 6 is provided on part of the n-type nitride semiconductor layer 2 which is exposed at the bottom surface of the recessed portion 20.

In the present embodiment, the n-type GaN substrate 1 may be replaced by a substrate of a different type from the GaN substrate, such as an m-plane SiC substrate, an m-plane sapphire substrate, a γ-LiAlO$_2$ substrate, or the like. Alternatively, a semiconductor layer formed on such a substrate, such as a GaN layer, may be used in substitution for the n-type GaN substrate 1.

As the semiconductor multilayer structure 16, a GaN layer may be formed or, alternatively, a layer of a different type from the GaN layer, for example, an Al$_x$Ga$_y$In$_z$N layer (0≤x≤1, 0≤z≤1, x+y+z=1) layer, may be formed. The semiconductor multilayer structure 16 does not need to have a single-layer structure. The semiconductor multilayer structure 16 may be formed by a plurality of layers which have different constituents.

To decrease the absorption of light by the n-type GaN substrate (or GaN layer) 1 that has an m-plane principal surface, the donor impurity concentration of the n-type GaN substrate (or GaN layer) 1 that has an m-plane principal surface is preferably not more than $5\times10^{18}$ cm$^{-3}$, more preferably not more than $5\times10^{17}$ cm$^{-3}$. When a horizontal type light-emitting device is mounted face up (FIG. 6), light goes out from the p-type nitride semiconductor layer 4 side. On the other hand, when a horizontal type light-emitting device is mounted face down (FIG. 7), light goes out from the n-type GaN substrate (or GaN layer) 1 side. Therefore, the importance of decreasing the donor impurity concentration of the n-type GaN substrate (or GaN layer) 1 is higher in the face-up type configuration than in the face-down type configuration. In the horizontal type light-emitting device, the current flowing through the n-type GaN substrate (or GaN layer) 1 is not large, whereas in the vertical type light-emitting device (FIG. 8), a large current flows through the n-type GaN substrate (or GaN layer) 1. Therefore, in the vertical type light-emitting device, it is necessary to decrease the donor impurity concentration of the n-type GaN substrate (or GaN layer) 1 from not only the viewpoint of preventing absorption of light but also the viewpoint of enhancing diffusion of a current.

The n-type nitride semiconductor layer 2 may be an n-type GaN layer doped with silicon as a major donor impurity. The donor impurity is preferably silicon. However, the n-type nitride semiconductor layer 2 may be doped with oxygen in addition to silicon. The n-type nitride semiconductor layer 2 may be an InGaN layer, an AlGaN layer, or a multilayer structure thereof. The n-type nitride semiconductor layer 2 also functions as a layer which is in contact with the n-electrode 6. Horizontal diffusion of electrons may be achieved by increasing the donor impurity concentration of the n-type nitride semiconductor layer 2. However, if the impurity concentration is excessively increased, the crystallinity disadvantageously deteriorates. In an actual case, the donor impurity concentration is not more than $5\times10^{18}$ cm$^{-3}$, more preferably not more than $5\times10^{17}$ cm$^{-3}$, so that the crystallinity can be maintained.

The current diffusing layer 7 may be an n-type GaN layer which is heavily doped with the donor impurity and which has an m-plane principal surface. As will be described later with reference to simulation results, the donor impurity concentration of the current diffusing layer 7 is preferably not less than $5\times10^{18}$ cm$^{-3}$, more preferably not less than $5\times10^{18}$ cm$^{-3}$ and not more than $5\times10^{19}$ cm$^{-3}$.

An important feature of the present embodiment is that there is a sufficiently large difference in donor impurity concentration between the current diffusing layer 7 and the n-type nitride semiconductor layer 2. When the donor impurity concentration of the current diffusing layer 7 is ten or more times the donor impurity concentration of the n-type nitride semiconductor layer 2, the resistivity of the current diffusing layer 7 is sufficiently small, e.g., not more than ⅒ of the resistivity of the n-type nitride semiconductor layer 2. If the resistivity of the current diffusing layer 7 is not more than ⅒ of the resistivity of the n-type nitride semiconductor layer 2, electrons injected via the n-electrode 6 sufficiently spread through the current diffusing layer 7. Therefore, concentration of a current in an area where the space between the p-electrode 5 and the n-electrode 6 is smallest would not readily occur.

As the current diffusing layer 7, an InGaN layer, an AlGaN layer, or a multilayer structure thereof may be formed. The current diffusing layer 7 is preferably formed so as to generally cover the entire n-type GaN substrate (or GaN layer) 1 that has an m-plane principal surface and so as to be in contact with the n-type GaN substrate (or GaN layer) 1.

Further, the thickness of the current diffusing layer 7 is preferably not less than 25 nm and not more than 2 μm. When the thickness of the current diffusing layer 7 is in this range, increase of the manufacturing cost due to prolongation of the time required for crystal growth is avoided and, meanwhile, the current can be sufficiently diffused. Details of this aspect will be described later with reference to simulation results. Note that as the thickness of the semiconductor layer increases, deterioration of the crystallinity which is caused by increasing the impurity concentration increases. Since the donor impurity concentration of the current diffusing layer 7 is ten or more times the donor impurity concentration of the n-type nitride semiconductor layer 2, it is preferred that the thickness of the current diffusing layer 7 is small such that deterioration of the crystallinity can be prevented. Specifically, the thickness of the current diffusing layer 7 is, more preferably, not less than 25 nm and not more than 400 nm.

The thickness of the n-type nitride semiconductor layer 2 is preferably not less than 1 μm and not more than 10 μm. There are two reasons why the preferred thickness of the n-type nitride semiconductor layer 2 is not less than 1 μm, as will be described below.

The first reason is that sufficient process margins in manufacture can be secured. In the case of a horizontal type semiconductor device, in order to allow the n-electrode 6 to be in contact with the n-type nitride semiconductor layer 2, the recessed portion 20 is formed as shown in FIG. 5. In the step of forming the recessed portion 20, it is necessary to surely remove part of the p-type nitride semiconductor layer 4 and the active region 3 such that the n-type nitride semiconductor layer 2 is partially exposed. This is usually achieved by dry etching. However, if the n-type nitride semiconductor layer 2 is excessively thin, e.g., less than 1 μm, the n-type nitride semiconductor layer 2 might be entirely removed due to variation in the dry etching conditions, and the current diffusing layer 7 might be exposed.

The second reason is that excellent crystallinity can be secured. In the early phase of the crystal growth, a semiconductor with insufficient crystallinity readily grows. Thus, to improve the crystallinity, it is necessary to secure a somewhat effective thickness (e.g., not less than 1 µm). In this way, the thickness of the n-type nitride semiconductor layer 2 is preferably not less than 1 µm. However, when the thickness is not less than 1 µm, the donor impurity concentration should not be enormously increased from the viewpoint of preventing deterioration of the crystallinity. In view of such, in the present embodiment, a new component, the current diffusing layer 7, is provided and the donor impurity concentration of this layer is increased, whereby uniform current injection into the active layer is realized.

Meanwhile, since the thickness of the n-type nitride semiconductor layer 2 is not more than 10 µm, absorption of light in the n-type nitride semiconductor layer can be reduced. The total thickness of the n-type GaN substrate (or GaN layer) 1 and the n-type nitride semiconductor layer 2 is preferably not less than 2 µm and not more than 150 µm. Due to such a thickness, the absorption of light in the n-type GaN substrate (or GaN layer) 1 that has an m-plane principal surface and the n-type nitride semiconductor layer 2 is reduced, so that the light output can be increased.

To decrease the contact resistance between the n-electrode 6 and the n-type nitride semiconductor layer 2 while the conductivity of the n-type nitride semiconductor layer 2 is maintained, the donor impurity concentration of the n-type nitride semiconductor layer 2 is preferably not less than $1 \times 10^{17}$ cm$^{-3}$. Likewise, to secure the conductivity of the n-type GaN substrate (or GaN layer) 1, the donor impurity concentration of the n-type GaN substrate (or GaN layer) 1 is preferably not less than $1 \times 10^{17}$ cm$^{-3}$. From the lower limit of the donor impurity concentration of the n-type nitride semiconductor layer 2 ($1 \times 10^{17}$ cm$^{-3}$) and the upper limit of the donor impurity concentration of the current diffusing layer 7 ($5 \times 10^{19}$ cm$^{-3}$), it is deduced that the donor impurity concentration of the current diffusing layer 7 is not more than 500 times the donor impurity concentration of the n-type nitride semiconductor layer 2.

The active layer 3 may be a single-quantum well in which an InGaN layer serves as a quantum well or a multi-quantum well. In the active layer 3, a barrier layer may be formed by a GaN layer or an InGaN layer. The thickness of the InGaN quantum well layer may be approximately 2 nm to 30 nm. The thickness of the barrier layer may be approximately 5 nm to 50 nm.

The p-type nitride semiconductor layer 4 is a p-type GaN layer which is doped with magnesium as a major acceptor impurity. The p-type nitride semiconductor layer 4 may be an InGaN layer, an AlGaN layer, or a multilayer structure thereof. Although not particularly shown, for the purpose of preventing overflow of electrons, a p-type AlGaN layer having a thickness of about 15 nm to 30 nm may be inserted into the p-type nitride semiconductor layer 4.

The electrode material of the n-electrode 6 is preferably selected from metals which are capable of making a desirable contact resistance with the n-type nitride semiconductor layer 2. For example, the n-electrode 6 may be formed by a multilayer structure of a Ti layer, an Al layer and a Pt layer. The thickness of the n-electrode 6 may be 100 nm to 200 nm.

The electrode material of the p-electrode 5 is preferably selected from metals which are capable of making a desirable contact resistance with the p-type nitride semiconductor layer 4. However, it is necessary to carry out the selection with consideration for the differences among respective configurations, the horizontal face-up type configuration, the horizontal face-down type configuration, and the vertical type configuration. Each of the different configurations will be described below.

(Horizontal Face-Up Type Configuration)

Figure 6:
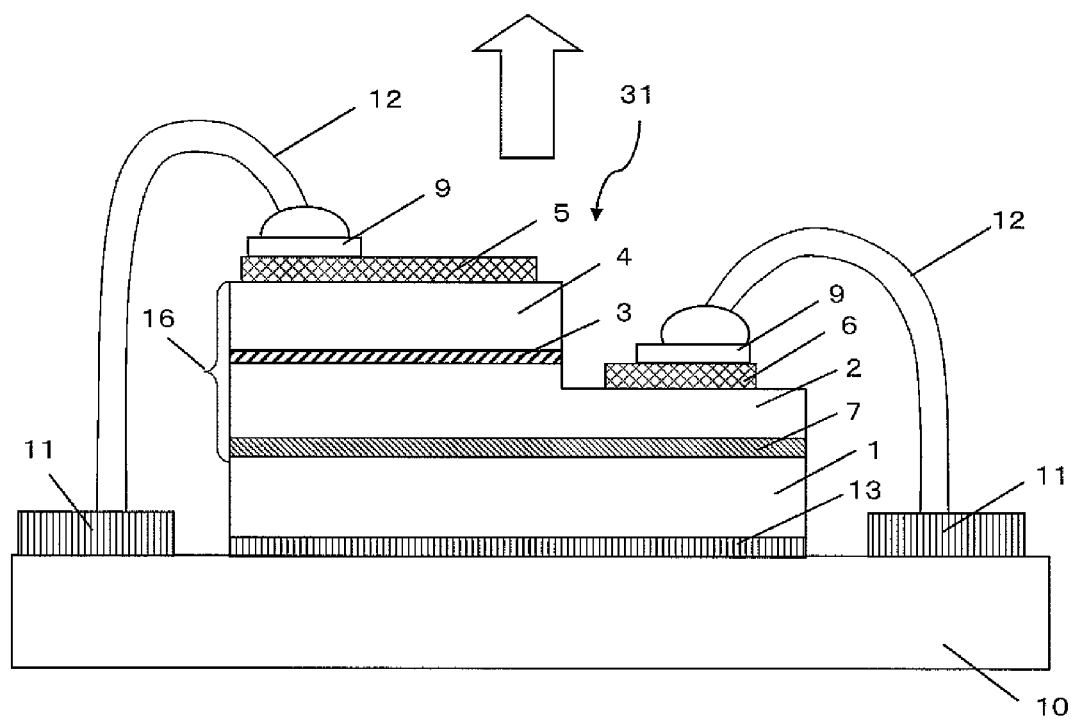
FIG. 6 is a cross-sectional view showing a structure of a semiconductor device which has a face-up type configuration where light goes out from the p-type nitride semiconductor layer 4 side.

FIG. 6 shows a cross-sectional structure of a semiconductor device which has a face-up type configuration where light goes out from the p-type nitride semiconductor layer 4 side. In FIG. 6, components which are the same as those of FIG. 5 are denoted by the same reference numerals. Here, the detailed descriptions of those components are omitted.

In FIG. 6, the nitride-based semiconductor light-emitting device 31 of the present embodiment is mounted to a mounting base 10 such that the p-type nitride semiconductor layer 4 is at the top side. The mounting base 10 is preferably made of a material which has high thermal conductivity, for example, alumina, aluminum nitride, or the like. Alternatively, the mounting base 10 may be made of copper or aluminum with an insulator film covering the surface of the copper or aluminum body.

A reflector film 13 is interposed between the n-type GaN substrate (or GaN layer) 1 that has an m-plane principal surface and the mounting base 10. The reflector film 13 is preferably made of, for example, Ag, Al, Ni, W, Ti, Au or Sn, or formed by a multilayer structure made of these metals. In that case, it is preferred that a metal of high reflectance, such as Ag, Al or Ni, is positioned so as to be in contact with the n-type GaN substrate (or GaN layer) 1.

On the surfaces of the p-electrode 5 and the n-electrode 6, pad electrodes 9 are provided. The pad electrodes 9 are made of, for example, Au. The mounting base 10 has interconnection wires 11 on its surface. Au wires 12 are provided so as to electrically couple the pad electrodes 9 and the interconnection wires 11. In the case of the face-up type that has such a configuration, light going out from the device needs to pass through the p-electrode 5. Thus, the p-electrode 5 may be a transparent electrode made of ITO or the like, or may be formed by a very thin film of Ni or the like.

(Horizontal Face-Down Type Configuration)

Figure 7:
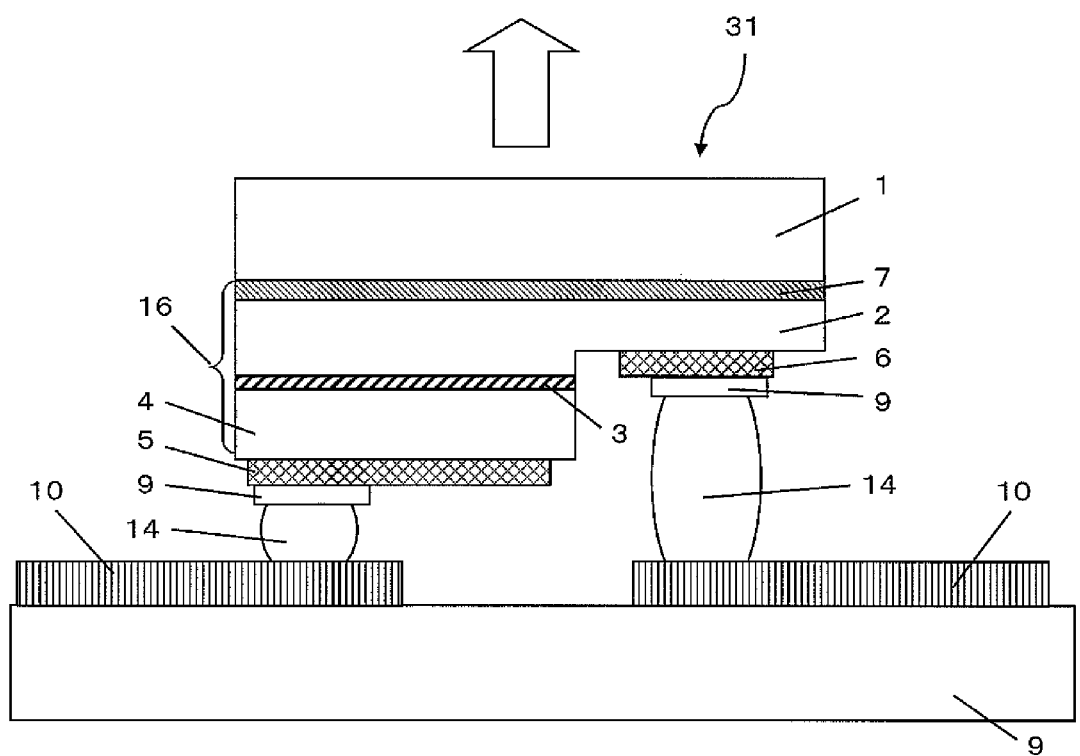
FIG. 7 is a cross-sectional view showing a structure of a semiconductor device which has a face-down type configuration where light goes out from the n-type nitride semiconductor layer 2 side.

FIG. 7 shows a cross-sectional structure of a semiconductor device which has a face-down type configuration where light goes out from the n-type nitride semiconductor layer 2 side. In FIG. 7, components which are the same as those of FIG. 5 are denoted by the same reference numerals. Here, the detailed descriptions of those components are omitted.

In FIG. 7, the nitride-based semiconductor light-emitting device 31 of the present embodiment is mounted to a mounting base 10 such that the p-type nitride semiconductor layer 4 is at the bottom side. The mounting base 10 is preferably made of a material which has high thermal conductivity, for example, alumina, aluminum nitride, or the like. Alternatively, the mounting base 10 may be made of copper or aluminum with an insulator film covering the surface of the copper or aluminum body.

On the surfaces of the p-electrode 5 and the n-electrode 6, pad electrodes 9 are provided. The pad electrodes 9 are made of, for example, Au. The mounting base 10 has interconnection wires 11 on its surface. Au bumps 14 are provided so as to electrically couple the pad electrodes 9 and the interconnection wires 11. In the case of the face-down type that has such a configuration, light goes out from the GaN substrate (or GaN layer) 1 side. Thus, the p-electrode 5 is preferably made of a metal which has high reflectance, for example, Ag.

(Vertical Type (Attached Type) Configuration)

Figure 8:
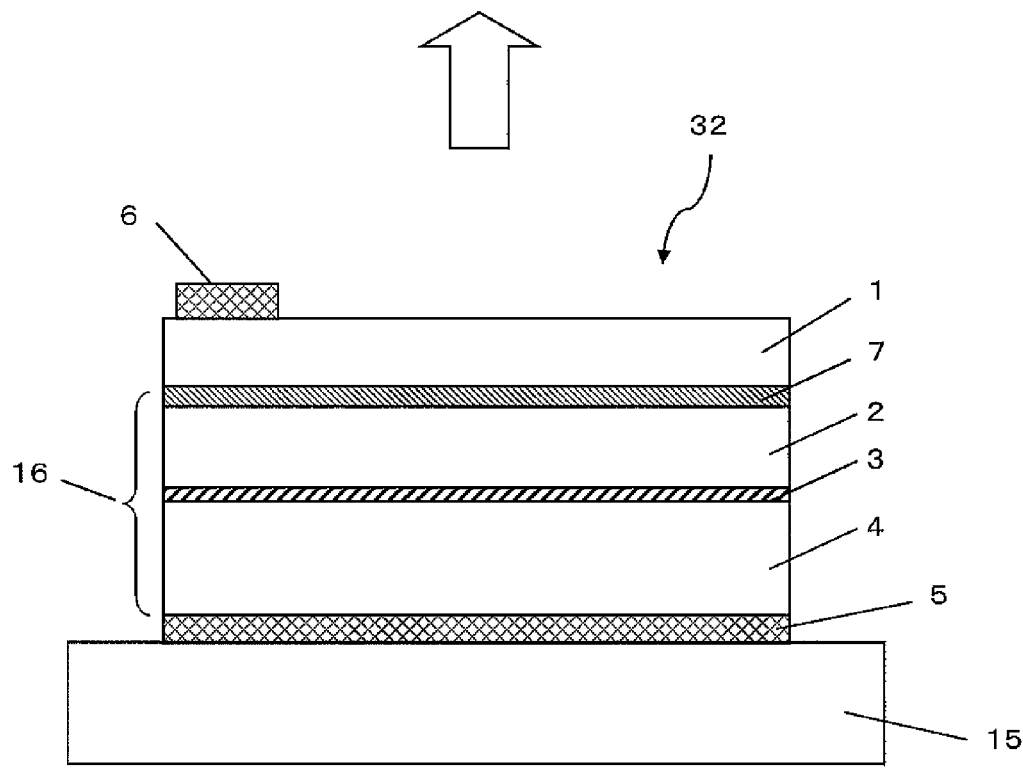
FIG. 8 is a cross-sectional view showing a vertical type semiconductor device which is a variation of the embodiment of the present invention.

FIG. 8 is a cross-sectional view showing a vertical type semiconductor device which is a variation of the embodiment of the present invention. In FIG. 8, components which have the same functions as those of FIG. 5 are denoted by the same reference numerals.

The nitride-based semiconductor light-emitting device 32 shown in FIG. 8 also includes the n-type GaN substrate (or GaN layer) 1 and the semiconductor multilayer structure 16, which includes the current diffusing layer 7, the n-type nitride semiconductor layer 2, the active layer 3, the p-type nitride semiconductor layer 4, as do the nitride-based semiconductor light-emitting devices 31 shown in FIG. 5, FIG. 6 and FIG. 7. The nitride-based semiconductor light-emitting device 32 is different from the nitride-based semiconductor light-emitting device 31 in that the n-electrode 6 is provided on a surface of the n-type GaN substrate (or GaN layer) 1 which is opposite to the surface that is in contact with the semiconductor multilayer structure 16. The p-electrode 5 is provided so as to entirely cover a surface of the p-type nitride semiconductor layer 4 which is opposite to the surface that is in contact with the semiconductor multilayer structure 16.

In the nitride-based semiconductor light-emitting device 32 of FIG. 8, light goes out from the n-type nitride semiconductor layer 2 side. Thus, the p-electrode 5 is preferably made of a metal which has high reflectance, for example, Ag.

The nitride-based semiconductor light-emitting device 32 is attached onto a conductive supporting substrate 15 such that the p-type nitride semiconductor layer 4 is at the bottom side. The conductive supporting substrate 15 is preferably made of a material which has electric conductivity and which has high thermal conductivity. For example, the conductive supporting substrate 15 is preferably made of silicon, germanium, copper, or aluminum.

In the case of the vertical type, it is important whether or not the n-type GaN substrate (or GaN layer) 1 has electric conductivity. For example, when an m-plane GaN layer formed on an m-plane sapphire substrate is used instead of the n-type GaN substrate 1, the vertical type configuration cannot be adopted without removing the m-plane sapphire substrate because the m-plane sapphire substrate has an insulative property. However, when the m-plane sapphire substrate is peeled away such that only the m-plane GaN layer is left, the vertical type configuration can be adopted. Thus, in the case of the vertical type, the n-electrode 6 is provided on the rear surface of the n-type GaN substrate (or GaN layer) 1 that has an m-plane principal surface while the electric conductivity of the n-type GaN substrate (or GaN layer) 1 that has an m-plane principal surface is secured.

In the nitride-based semiconductor light-emitting device 32, electrons injected via the n-electrode 6 first flow into the n-type GaN substrate (or GaN layer) 1 and then pass through the current diffusing layer 7 and the n-type nitride semiconductor layer 2 to flow into the active layer 3. Therefore, to make uniform the current injected into the active layer 3, not only the relationship in donor impurity concentration between the current diffusing layer 7 and the n-type nitride semiconductor layer 2 but also the relationship in donor impurity concentration between the n-type GaN substrate (or GaN layer) 1 and the current diffusing layer 7 are important.

Thus, in the nitride-based semiconductor light-emitting device 32, it is preferred that the donor impurity concentration of the current diffusing layer 7 is ten or more times the donor impurity concentration of the n-type GaN substrate (or GaN layer) 1. In this case, electrons injected via the n-electrode 6 can be horizontally diffused.

At the same time, the donor impurity concentration of the n-type GaN substrate (or GaN layer) 1 that has an m-plane principal surface is preferably not more than $5 \times 10^{18}$ cm$^{-3}$, more preferably $5 \times 10^{17}$ cm$^{-3}$.

Also, in the vertical-type nitride-based semiconductor light-emitting device 32, the relationship in donor impurity concentration between the n-type nitride semiconductor layer 2 and the current diffusing layer 7 is basically the same as that in the nitride-based semiconductor light-emitting device 31 shown in FIG. 5.

<Description of Effects of the Present Invention Based on Simulation Results>

In the present invention, the donor impurity concentration and the thickness of the current diffusing layer 7 were calculated based on the simulation results. Hereinafter, the simulation results will be described.

Figure 9:
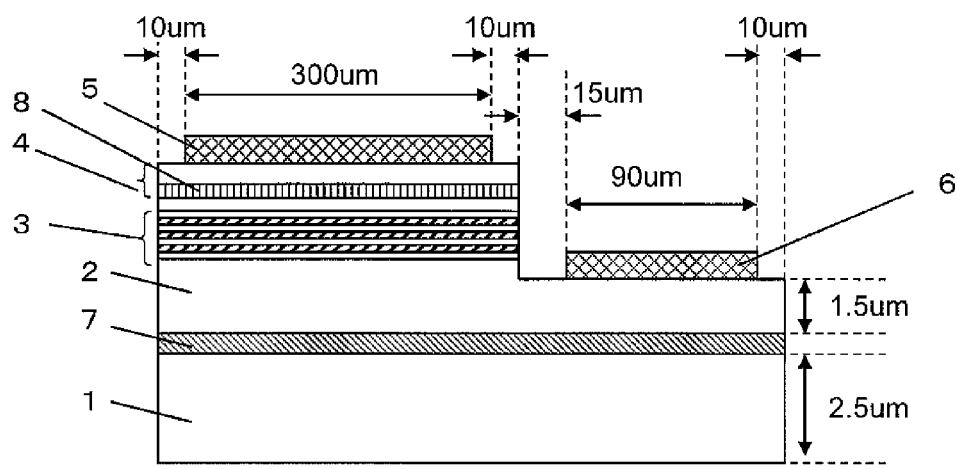
FIG. 9 shows a cross-sectional structure of a nitride-based semiconductor device used in a simulation.

FIG. 9 shows a cross-sectional structure of a nitride-based semiconductor device used in a simulation. The simulation was carried out with a horizontal type nitride semiconductor device. In FIG. 9, components which are the same as those of FIG. 5 are denoted by the same reference numerals, and the detailed descriptions thereof are omitted. The thickness of the n-type GaN substrate (or GaN layer) 1 that has an m-plane principal surface was 2.5 µm, and the impurity concentration was $4 \times 10^{17}$ cm$^{-3}$. The n-type nitride semiconductor layer 2 was a 2.5 µm thick n-type GaN layer with an impurity concentration of $4 \times 10^{17}$ cm$^{-3}$. The active layer 3 was a triple-quantum well consisting of 15 nm thick $In_{0.2}Ga_{0.8}N$ quantum well layers and 30 nm thick GaN barrier layers. The p-type nitride semiconductor layer 4 was a 150 nm thick p-type GaN with an impurity concentration of $5 \times 10^{17}$ cm$^{-3}$. The p-type nitride semiconductor layer 4 included a 150 nm thick $Al_{0.2}Ga_{0.8}N$ layer 8 with an impurity concentration of $5 \times 10^{17}$ cm$^{-3}$ for the purpose of prevent overflow of electrons. The size of the p-electrode 5 was 300 µm. The size of the n-electrode 6 was 90 µm. The space between the p-electrode 5 and the n-electrode 6 was 25 µm. The simulation was carried out with the donor impurity concentration and the thickness of the current diffusing layer 7 being considered as the parameters. The light output was assumed as being 100%.

Figure 10:
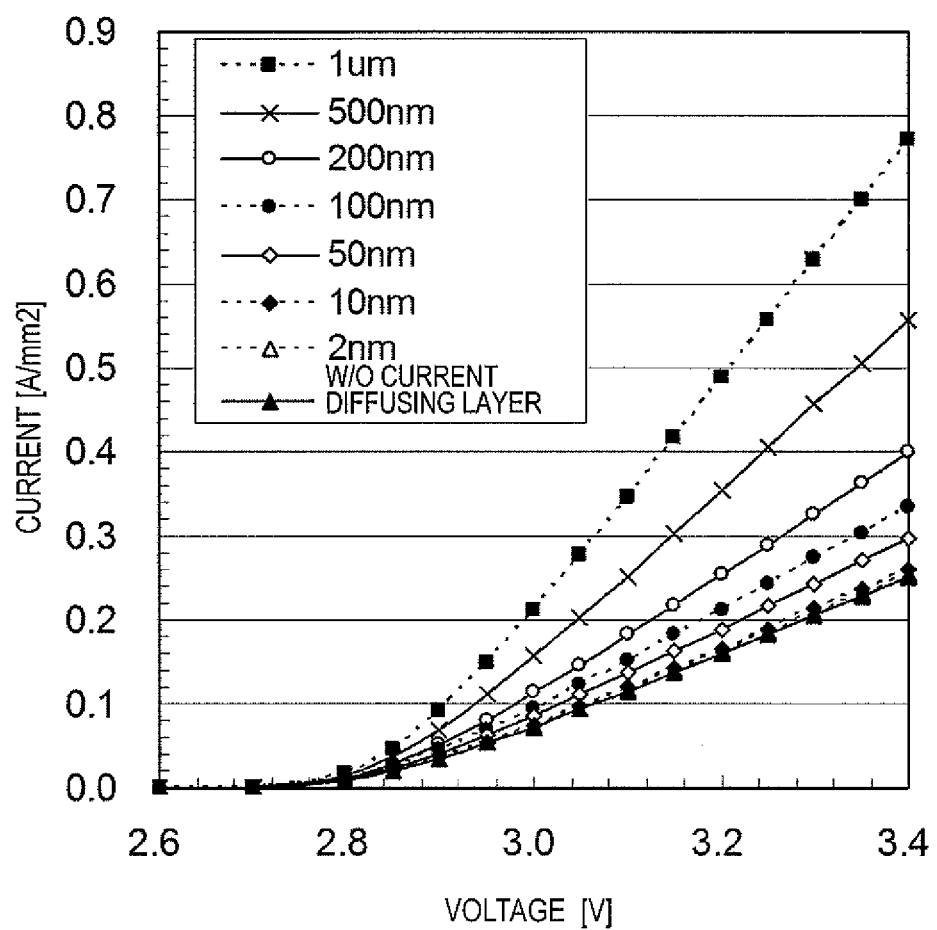
FIG. 10 is a graph showing the current-voltage characteristic (simulation result) of a nitride-based semiconductor light-emitting device which is an embodiment of the present invention.

FIG. 10 is a graph showing the simulation results of the current-voltage characteristic of the current diffusing layer 7 having different thicknesses. The simulation of FIG. 10 was carried out with the thickness of the current diffusing layer 7 varying from 2 nm to 1 µm, while the donor impurity concentration of the current diffusing layer 7 was maintained constant at $1 \times 10^{19}$ cm$^{-3}$. As seen from FIG. 10, as the thickness of the current diffusing layer 7 increases, the current readily flows even at a lower voltage (i.e., the operating voltage decreases). From this result, it is understood that the current diffusing layer 7 improves the flowability of the current.

Figure 11:
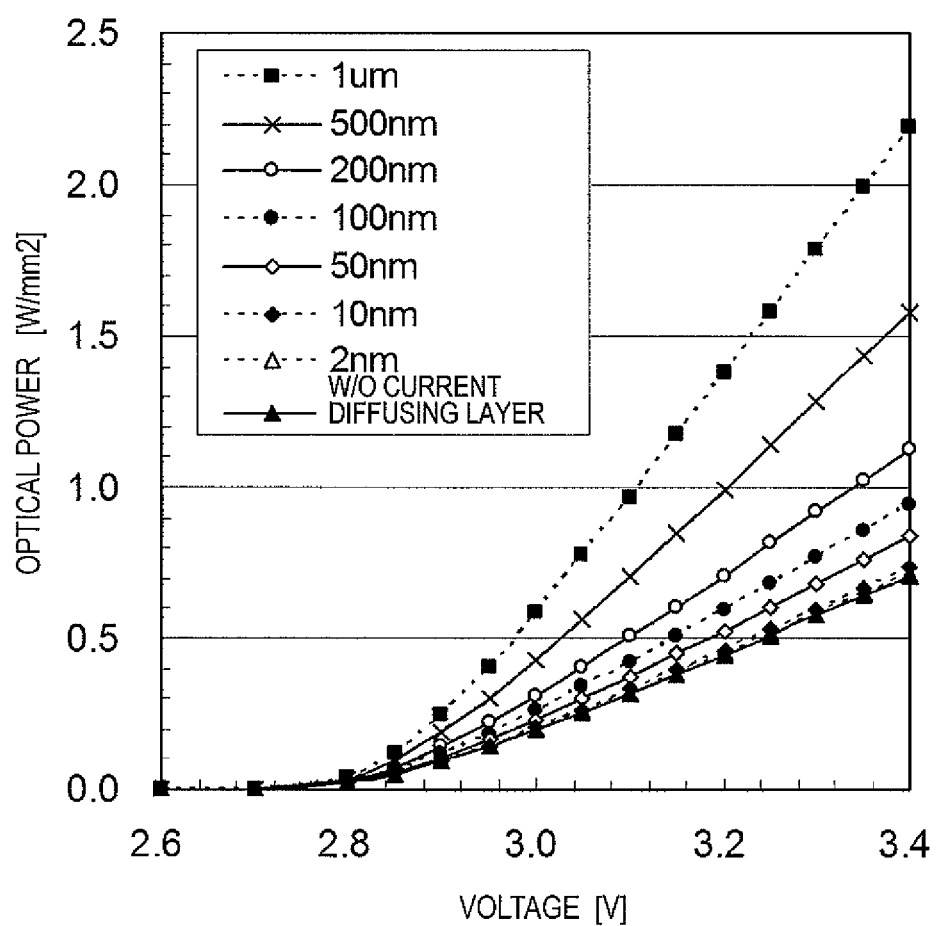
FIG. 11 is a graph showing the optical power-voltage characteristic (simulation result) of a nitride-based semiconductor light-emitting device which is an embodiment of the present invention.

FIG. 11 is a graph showing the simulation results of the voltage-optical power characteristic of the current diffusing layer 7 having different thicknesses. The simulation of FIG. 11 was carried out with the thickness of the current diffusing layer 7 varying from 2 nm to 1 µm, while the donor impurity concentration of the current diffusing layer 7 was maintained constant at $1 \times 10^{19}$ cm$^{-3}$. As seen from FIG. 11, as the thickness of the current diffusing layer 7 increases, the optical power improves. This is because, as seen from FIG. 10, the operating voltage decreases as the thickness of the current diffusing layer 7 increases, and therefore, the current value increases even the applied voltage remains the same.

From the simulation results of FIG. 10 and FIG. 11, it was deduced that, when the current diffusing layer 7 is provided, the current value increases, and the optical power also increases.

Figure 12:
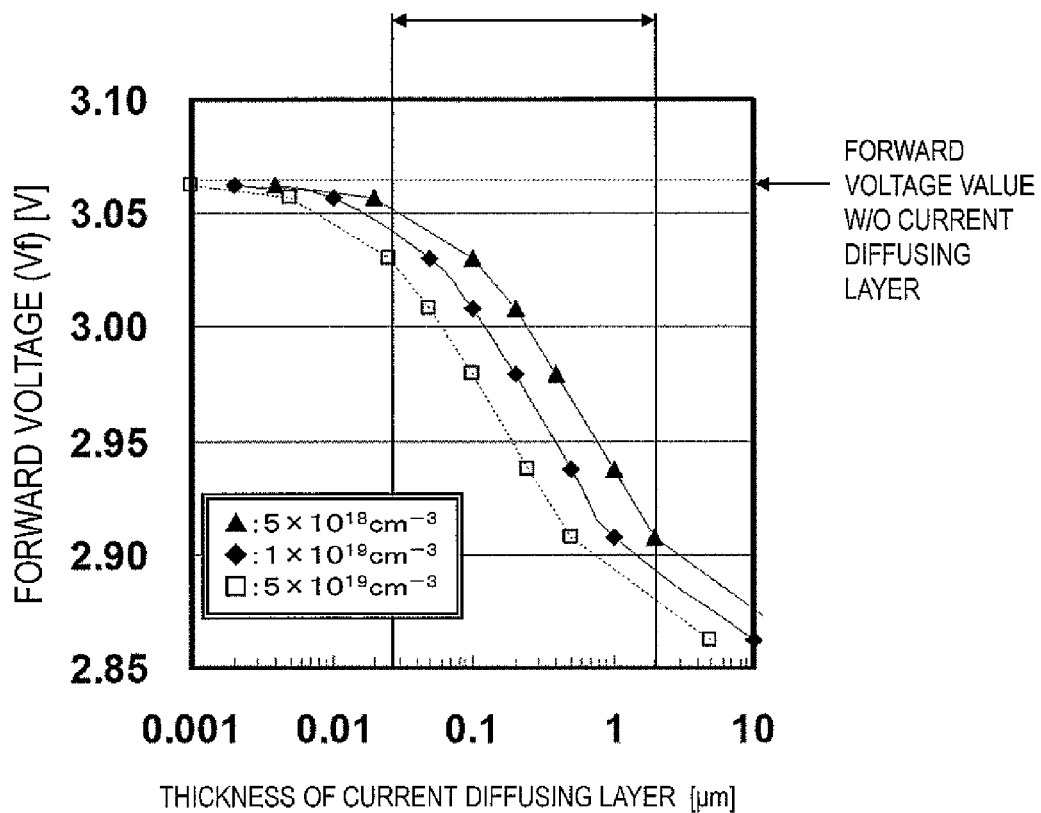
FIG. 12 is a graph showing the relationship between the thickness of a current diffusing layer and the forward voltage (simulation result) of a nitride-based semiconductor light-emitting device which is an embodiment of the present invention.

FIG. 12 is a graph showing the simulation results of the relationship between the thickness of the current diffusing layer 7 and the forward voltage Vf, with the donor impurity concentration of the current diffusing layer 7 having three different values, $5\times10^{18}$ cm$^{-3}$, $1\times10^{19}$ cm$^{-3}$, and $5\times10^{19}$ cm$^{-3}$. This simulation was carried out with the donor impurity concentration of the current diffusing layer 7 being ten or more times the donor impurity concentration of the n-type GaN substrate (or GaN layer) 1 and the donor impurity concentration of the n-type nitride semiconductor layer 2. Here, the forward voltage Vf refers to a voltage value which was obtained when the current value reached 100 [mA/mm$^2$].

As seen from FIG. 12, at either value of the donor impurity concentration, the forward voltage Vf remarkably decreases as the thickness of the current diffusing layer 7 exceeds about 25 nm. As the thickness of the current diffusing layer 7 exceeds about 2 μm, the forward voltage Vf starts to converge to a constant value.

Figure 13:
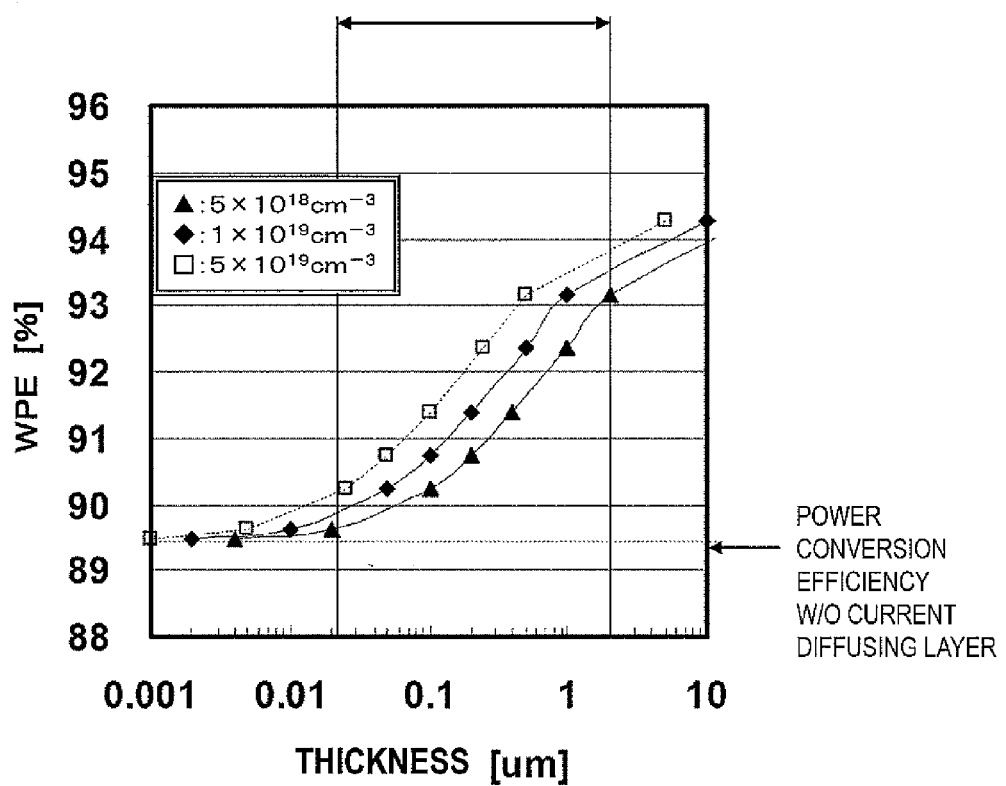
FIG. 13 is a graph showing the relationship between the thickness of a current diffusing layer and the power conversion efficiency (simulation result) of a nitride-based semiconductor light-emitting device which is an embodiment of the present invention.

FIG. 13 is a graph showing the simulation results of the relationship between the thickness of the current diffusing layer 7 and the power conversion efficiency (Wall Plug Efficiency: WPE), with the donor impurity concentration of the current diffusing layer 7 having three different values, $5\times10^{18}$ cm$^{-3}$, $1\times10^{19}$ cm$^{-3}$, and $5\times10^{19}$ cm$^{-3}$. In the simulation, the contact resistance of the p-electrode was $1\times10^{-3}$ Ωcm$^2$, and the contact resistance of the n-electrode was $1.2\times10^{-4}$ Ωcm$^2$. The light extraction efficiency was assumed as being 100%. The power conversion efficiency was calculated with a value which made the current value reach 100 [mA/mm$^2$]. The reason why the simulation results are extremely high as compared with the power conversion efficiencies of commercially-available nitride-based semiconductor light-emitting devices is that the calculation was carried out with the light extraction efficiency being 100%.

As seen from FIG. 13, at either value of the donor impurity concentration, the WPE remarkably increases as the thickness of the current diffusing layer 7 exceeds about 25 nm. As the thickness of the current diffusing layer 7 exceeds about 2 μm, the value of the WPE starts to saturate.

In the simulation results shown in FIG. 12 and FIG. 13, decrease of the forward voltage Vf and improvement of the WPE are possible in the range of the donor impurity concentration of the current diffusing layer 7 from $5\times10^{18}$ cm$^{-3}$ to $5\times10^{19}$ cm$^{-3}$. From these results, it is deduced that the donor impurity concentration of the current diffusing layer 7 is preferably in the range from $5\times10^{18}$ cm$^{-3}$ to $5\times10^{19}$ cm$^{-3}$.

From the simulation results shown in FIG. 12 and FIG. 13, in the range of the donor impurity concentration of the current diffusing layer 7 from $5\times10^{18}$ cm$^{-3}$ to $5\times10^{19}$ cm$^{-3}$, when the thickness of the current diffusing layer 7 is not less than 25 nm, the decrease of the forward voltage Vf and the improvement of the WPE are remarkable as compared with a configuration which does not include the current diffusing layer 7. This tendency continues till the current diffusing layer 7 becomes 2 μm or thinner. From these results, it is seen that sufficient horizontal diffusion of electrons is enabled by the current diffusing layer 7 so long as the thickness of the current diffusing layer 7 is not less than 25 nm. Also, it is estimated that the obtained effects do not largely change even when the thickness of the current diffusing layer 7 is greater than 2 μm. Thus, from the viewpoint of shortening the crystal growth time, the thickness of the current diffusing layer 7 is preferably not more than 2 μm.

In the simulations of FIG. 10 to FIG. 13, the donor impurity concentration in the n-type GaN substrate (or GaN layer) 1 and the n-type nitride semiconductor layer 2 was constant at $4\times10^{17}$ cm$^{-3}$. Even when the donor impurity concentration has a value which is different from this value, sufficient diffusion of the current is enabled by the current diffusing layer 7 so long as the donor impurity concentration of the current diffusing layer 7 is sufficiently higher than the donor impurity concentration of the n-type nitride semiconductor layer 2.

The simulations of FIG. 10 and FIG. 11 were carried out with the donor impurity concentration of the n-type nitride semiconductor layer 2 being $4\times10^{17}$ cm$^{-3}$ and the donor impurity concentration of the current diffusing layer 7 being $1\times10^{19}$ cm$^{-3}$. On the other hand, the simulations of FIG. 12 and FIG. 13 were carried out with the donor impurity concentration of the n-type nitride semiconductor layer 2 being $4\times10^{17}$ cm$^{-3}$ and the donor impurity concentration of the current diffusing layer 7 being $5\times10^{18}$ cm$^{-3}$, $1\times10^{19}$ cm$^{-3}$, or $5\times10^{19}$ cm$^{-3}$. In all of these simulations, the donor impurity concentration of the current diffusing layer 7 is ten or more times the donor impurity concentration of the n-type nitride semiconductor layer 2. From these results, it is deduced that, as a general target for the donor impurity concentration of the current diffusing layer 7, it is preferably set so as to be ten or more times the donor impurity concentration of the n-type nitride semiconductor layer 2. In the case where there is a difference of 10 or more times in impurity concentration between the current diffusing layer 7 and the n-type nitride semiconductor layer 2, the resistivity of the current diffusing layer 7 is sufficiently small, e.g., not more than ⅒ of the resistivity of the n-type nitride semiconductor layer 2. Therefore, electrons injected via the n-electrode 6 mainly flow through the current diffusing layer 7 that has a sufficiently small resistance.

Although the simulations were carried out with the horizontal type examples shown in FIG. 6 and FIG. 7, it is estimated that, even in the vertical type configuration shown in FIG. 8, sufficient horizontal diffusion of electrons is enabled so long as the donor impurity concentration and the thickness of the current diffusing layer 7 are in the above-described ranges. In the vertical type example, the current also flows through the n-type GaN substrate (or GaN layer) 1. Therefore, it is also preferred that the donor impurity concentration of the current diffusing layer 7 is ten or more times the donor impurity concentration of the n-type GaN substrate (or GaN layer) 1.

In the simulations, the calculation results were obtained on the assumption that there is one current diffusing layer 7. However, the effects of the present invention will be achieved even if there are a plurality of current diffusing layers 7. When there are multiple current diffusing layers, sufficient horizontal diffusion of electrons is enabled so long as the total thickness of the current diffusing layers is in the range from 25 nm and 2 μm, and crystal deterioration can be prevented due to the layer multiplicity, so that the current diffusing layers of higher quality can be realized.

The simulations were carried out on the assumption that the chip size is a square of 300 μm on each side. It is estimated that, as the chip size increases, the effects of the present application become more remarkable.

<Crystallinity of Semiconductor Layer>

Figure 14:
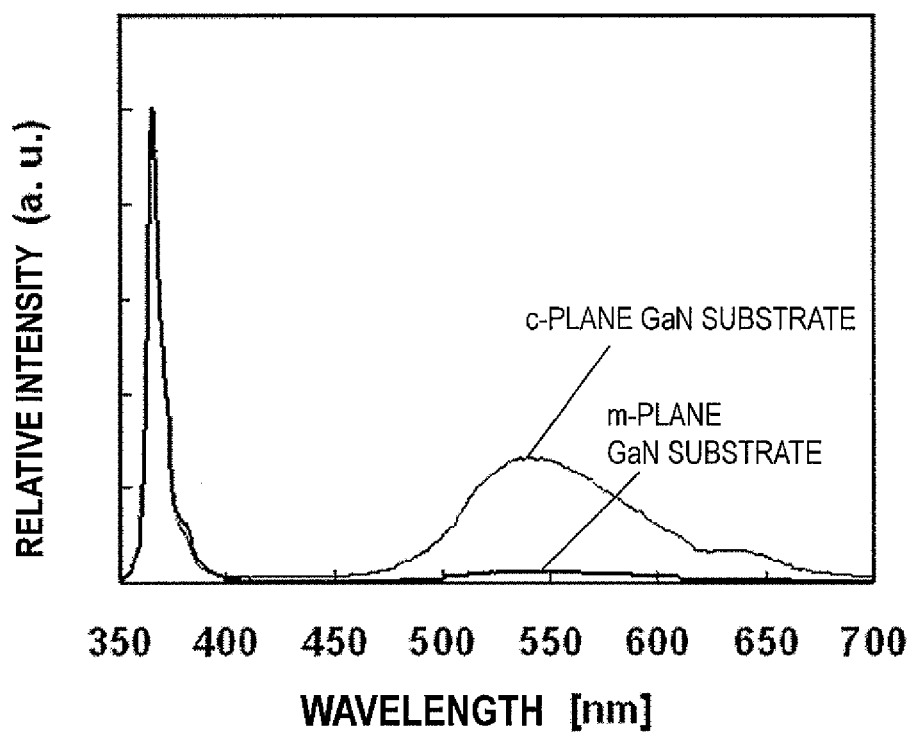
FIG. 14 is a graph showing the measurement results of photoluminescence of an n-type GaN layer formed on a c-plane substrate and an n-type GaN layer formed on an m-plane GaN substrate.

FIG. 14 is a graph showing the measurement results of photoluminescence of an n-type GaN layer formed on a c-plane substrate and an n-type GaN layer formed on an m-plane GaN substrate. The n-type GaN layers were both grown by metalorganic chemical vapor deposition. The donor impurity used was silicon. The n-type GaN layers both had a donor impurity concentration of $1\times10^{19}$ cm$^{-3}$ and a thickness of 100 nm. In FIG. 14, the abscissa axis represents the wavelength, and the ordinate axis represents the relative intensity. The value of the ordinate axis is a value which is normalized with the emission intensity near the GaN band edge.

As shown in FIG. 14, from either of the n-type GaN layer formed on the c-plane substrate and the n-type GaN layer formed on the m-plane substrate, an emission which has a sharp peak near the emission wavelength of 360 nm was observed. This peak generally corresponds to the energy bandgap between the conduction band and the valence band of GaN. As for this peak, there is no great difference between the n-type GaN layers.

On the other hand, from the n-type GaN layer formed on the c-plane GaN substrate, an emission which has a broad peak in the emission wavelength range from 450 nm to 700 nm was observed. This emission is called "Yellow Luminescence (YL)" and is estimated to be attributed to a deep impurity level. The YL is estimated to be attributed to dislocation of Ga and N from the GaN layer. It is estimated that, as the value of the YL increases, the crystallinity of the GaN layer decreases.

On the other hand, in the case of the n-type GaN layer formed on the m-plane GaN substrate, the emission intensity of the YL is sufficiently low as compared with the n-type GaN layer formed on the c-plane GaN substrate, although its impurity concentration is as high as $1 \times 10^{19}$ cm$^{-3}$. From this result, it is seen that, in the case of the n-type GaN layer formed on the m-plane GaN substrate, excellent crystallinity is maintained even when an impurity of high concentration is added as compared with the n-type GaN layer formed on the c-plane GaN substrate.

In the present embodiment, the current diffusing layer 7 has a high impurity concentration which is not less than $5 \times 10^{18}$ cm$^{-3}$ and not more than $5 \times 10^{19}$ cm$^{-3}$. From the results shown in FIG. 14, it is seen that, in the c-plane GaN layer which contains an impurity of such a high concentration, deterioration of the crystallinity advances. However, since the current diffusing layer 7 of the present embodiment has an m-plane surface, the crystallinity is maintained high even when it contains an impurity of high concentration.

The reason why such a difference occurs between the c-plane and the m-plane is not yet clarified. The inventor of the present application estimates that it is attributed to the difference in plane orientation between the c-plane GaN crystal and the m-plane GaN crystal. The silicon atom, which is a Group IV element used as the n-type dopant, can occupy the same lattice site as the gallium atom and therefore forms a bond with the nitrogen atom. In crystal growth, the nitrogen atom can have three bonds at the c-plane GaN surface, and the nitrogen atom can have two bonds at the m-plane GaN surface. Such bonds are estimated to have an effect on the formation process at the respective deep levels. In general, the YL emission is recognized as being an emission between a deep level resulting from a Ga vacancy or a residual C and a shallow donor level. It is estimated that the difference in state at the deep level makes a difference in YL emission between the n-type GaN layer formed on the m-plane GaN substrate and the n-type GaN layer formed on the c-plane GaN substrate.

The measurement illustrated in FIG. 14 was carried out with the use of a 100 nm thick n-type GaN layer. As seen from the results shown in FIG. 14, even though the impurity of $1 \times 10^{19}$ cm$^{-3}$ is contained, the crystallinity of the m-plane n-type GaN layer is maintained excellent so long as the thickness is about 100 nm. On the other hand, the thickness of the n-type nitride semiconductor layer 2 of FIG. 5 is, for example, 2.5 μm. As the thickness of the semiconductor layer increases, deterioration of the crystallinity due to the increase of the impurity concentration and absorption of light by the semiconductor layer are more likely to occur. Therefore, in the n-type nitride semiconductor layer 2, the impurity concentration needs to be not more than $5 \times 10^{18}$ cm$^{-3}$.

<Fabrication Method of Semiconductor Device>

Next, a fabrication method of an embodiment will be described with reference to FIG. 5, FIG. 6, FIG. 7 and FIG. 8.

Known examples of the method of forming a nitride semiconductor layer include molecular beam epitaxy (MBE), hydride vapor-phase epitaxy (HVPE), and metallorganic chemical vapor deposition (MOCVD). Here, the fabrication method which uses metallorganic chemical vapor deposition is described.

((S1) Step of Placing the N-Type GaN Substrate 1 in a Reactor)

The surface of the n-type GaN substrate 1 that has an m-plane principal surface is washed, and the washed substrate 1 is placed in a MOCVD apparatus. The washing is carried out using an organic solvent, a hydrofluoric acid, or the like.

((S2) Step of Forming a Current Diffusing Layer)

The n-type GaN substrate 1 is heated in the MOCVD apparatus to a crystal growth temperature of the n-type nitride semiconductor layer 2, i.e., 750° C. to 1150° C. In that process, it is preferred that the substrate temperature is increased while a nitrogen source gas, a Group III element source gas, and a donor impurity gas are supplied. By increasing the substrate temperature while the source gases are supplied in this way, the current diffusing layer 7 can be formed.

As described above, in the n-type GaN substrate 1 that has the m-plane principal surface, it is difficult to increase the n-type impurity concentration as compared with the n-type GaN substrate that has the c-plane principal surface. However, in the case of the nitride semiconductor which has the m-plane principal surface, there is a tendency that incorporation of the impurity increases as the crystal growth temperature decreases. Therefore, before the temperature of the substrate reaches a temperature in the range of 900° C. to 1150° C., which is suitable to crystal growth of the nitride semiconductor, supply of the nitrogen source gas at the flow rate of 330 mmol/min, the Group III element source gas at the flow rate of 73.5 mmol/min, and the donor impurity gas at the flow rate of 1.78 nmol/min to the substrate surface is started at, for example, 700° C., whereby the donor impurity is incorporated into the nitride semiconductor with a high concentration. In this way, the current diffusing layer 7 which has high impurity concentration and excellent crystallinity can be realized. In the step of forming the current diffusing layer 7 (S2), it is not necessary to continuously supply the nitrogen source gas, the Group III element source gas, and the donor impurity gas into the reactor. It is only required that the nitrogen source gas, the Group III source gas, and the donor impurity gas are contained in the atmosphere of the reactor. Therefore, the step of forming the current diffusing layer (S2) can be performed so long as the atmosphere in the reactor contains sufficient amounts of the nitrogen source gas, the Group III element source gas, and the donor impurity gas, even when the supply of the nitrogen source gas, the Group III element source gas, and the donor impurity gas is periodically or temporarily interrupted. The nitrogen source gas used in the present invention is typically ammonium. The Group III element source gas is an organic metal gas, such as trimethylgallium (TMG), triethylgallium (TEG), trimethylindium (TMI), trimethylaluminum (TMA), or the like. The organic metal gas is preferably supplied into the reactor in the form of a mixture gas which contains a nitrogen gas or a hydrogen gas as a carrier gas. The donor impurity gas is silane in the case of silicon doping but CO or water vapor in the case of oxygen doping. Note that, in addition to these source gases, a nitrogen gas or a hydrogen gas may be separately supplied into the reactor.

In the step of forming the current diffusing layer (S2), the increase rate of the substrate temperature (the temperature increasing rate) can be set, for example, in the range from 20° C./min to 100° C./min. The temperature increasing rate does not need to be constant. In the temperature increasing step, the substrate temperature may be temporarily maintained at a constant value or may be temporarily decreased.

For the purpose of stabilizing the crystal growth rate and fabricating the nitride-based semiconductor light-emitting device with a high yield, the supply rate (supply quantity) of the nitrogen source gas is preferably maintained generally constant throughout the current diffusing layer formation step (S2) and the growth step (S3).

The V/III ratio in the current diffusing layer formation step (S2) is preferably larger than the V/III ratio in the growth step (S3) which will be described later. The V/III ratio in the current diffusing layer formation step (S2) is set to, for example, 4000 or higher.

In the case of performing thermal cleaning of the surface of the n-type GaN substrate (or GaN layer) 1 that has an m-plane principal surface, the thermal cleaning temperature is set in the range of 600° C. to 900° C. By setting the temperature in such a range, the surface of the n-type GaN substrate (or GaN layer) 1 that has an m-plane principal surface can be cleaned. The thermal cleaning is preferably performed in ammonium, hydrogen, nitrogen, or a mixture gas atmosphere thereof.

For example, when the thermal cleaning is 700° C. and the growth temperature of the n-type nitride semiconductor layer 2 is 1000° C., the MOCVD apparatus is filled with an atmosphere which contains a TMG source gas, an ammonium gas, and a silane gas during the temperature increasing step from 700° C. to 1000° C., whereby crystal growth of a heavily-doped n-type GaN layer (current diffusing layer 7) can be performed.

((S3) Step of Growing a Nitride Semiconductor Layer on the Current Diffusing Layer)

Crystal growth for the semiconductor multilayer structure 16 which is formed by the n-type nitride semiconductor layer 2, the active layer 3, and the p-type nitride semiconductor layer 4 is carried out in the range of 750° C. to 1150° C. There nitride semiconductor layers only need to be an $Al_xGa_yIn_zN$ ($0 \leq x \leq 1$, $0 \leq y \leq 1$, $0 \leq z \leq 1$, $x+y+z=1$) crystal. The composition can be controlled by regulating the supply proportion of the Group III source gasses, TMA, TMG, and TMI.

(Formation of Electrodes)

Hereinafter, the fabrication method is separately described for the horizontal face-up type configuration, the horizontal face-down type configuration, and the vertical type configuration.

(Horizontal Face-Up Type Configuration)

After crystal growth of the semiconductor multilayer structure 16, parts of the active layer 3 and the p-type nitride semiconductor layer 4 are removed by lithography and then dry etching with the use of a chlorine gas so as to form the recessed portion 20 (shown in FIG. 5) such that part of the n-type nitride semiconductor layer 2 is exposed.

Then, at the exposed part of the n-type nitride semiconductor layer 2, the n-electrode 6 is formed of a metal, such as Ti or Al. The n-electrode 6 can be formed using an evaporation method and a lift-off method.

Then, on the upper surface of the p-type nitride semiconductor layer 4, the p-electrode 5 is formed using a transparent electrode of, for example, ITO, or a very thin film of, for example, Ni. The ITO can be formed by, for example, sputtering. The very thin film of Ni can be formed by, for example, an evaporation method. By performing the above processes, fabrication of the configuration of FIG. 5 is completed.

Then, mounting is performed to obtain the configuration shown in FIG. 6. Pad electrodes 9 are formed using a metal, such as Au, on the surfaces of the p-electrode 5 and the n-electrode 6. The pad electrodes 9 can be fabricated using an evaporation method, a plating method, or the like.

Then, on the rear side, i.e., the substrate side, of the resultant structure, the reflector film 13 is formed of Ag, Al, Ni, W, Ti, Au, Sn, or the like, or a multilayer structure thereof. The reflector film 13 can be formed using, for example, an evaporation method.

Then, the resultant structure is mounted to the mounting base 10 using a chip bonder. The interconnect of the resultant structure and the mounting base 10 is realized by Au—Au interconnect, Au—Sn interconnect, or the like.

In the last step, Au wires are formed on the pad electrodes 9 using a wire bonder, whereby fabrication of the horizontal face-up type nitride-based semiconductor light-emitting device shown in FIG. 6 is completed.

(Horizontal Face-Down Type Configuration)

After crystal growth of the semiconductor multilayer structure 16, parts of the active layer 3 and the p-type nitride semiconductor layer 4 are removed by lithography and dry etching with the use of a chlorine gas so as to form the recessed portion 20 (shown in FIG. 5) such that part of the n-type nitride semiconductor layer is exposed.

Then, at the exposed part of the n-type nitride semiconductor layer, the n-electrode 6 is formed of a metal, such as Ti or Al. The n-electrode 6 can be formed using an evaporation method and a lift-off method.

Then, on the upper surface of the p-type nitride semiconductor layer 4, the p-electrode 5 is formed using Ag. On the surface of Ag, an additional metal layer, such as W, Ti, Au, Sn, or the like, or a multilayer structure thereof, may be formed. The p-electrode may be formed by using an evaporation method and a lift-off method. By performing the above processes, fabrication of the configuration shown in FIG. 5 is completed.

Then, mounting is performed to obtain the configuration shown in FIG. 7. Pad electrodes 9 are formed using a metal, such as Au, on the surfaces of the p-electrode 5 and the n-electrode 6. The pad electrodes 9 can be fabricated using an evaporation method, a plating method, or the like.

Then, Au bumps 14 are formed on the pad electrodes 9 using an Au bump bonder.

In the last step, the resultant structure is mounted to the mounting base 10 using a flip-chip bonder, whereby fabrication of the horizontal face-down type nitride-based semiconductor light-emitting device shown in FIG. 7 is completed.

(Vertical Type Configuration)

After crystal growth of the semiconductor multilayer structure 16, the p-electrode 5 is formed using Ag on the surface of the p-type nitride semiconductor layer 4. On the surface of Ag, an additional metal layer, such as W, Ti, Au, Sn, or the like, or a multilayer structure thereof, may be formed. The p-electrode 5 may be formed by using an evaporation method.

Then, the resultant structure is attached onto the conductive supporting substrate 15 as shown in FIG. 8. The attachment is realized by Au—Au interconnect, Au—Sn interconnect, or the like.

Then, the n-electrode 6 is formed on the rear surface of the n-type GaN substrate (or GaN layer) 1 that has an m-plane principal surface. Since the n-type GaN substrate (or GaN layer) 1 is electrically conductive, the n-electrode 6 may be formed so as to be in contact with the rear surface of the n-type GaN substrate (or GaN layer) 1. On the other hand, when the n-type GaN substrate 1 is replaced by a sapphire substrate that is not electrically conductive, the m-plane sapphire substrate may be peeled off using, for example, a laser lift-off method before the n-electrode 6 is formed so as to be in contact with the n-type GaN layer. The n-electrode 6 can be formed of a metal, such as Ti or Al, using an evaporation method and a lift-off method. By performing the above processes, fabrication of the vertical type nitride-based semiconductor light-emitting device shown in FIG. 8 is completed.

An actual m-plane does not need to be perfectly parallel to the m-plane but may be inclined from the m-plane by a small angle (which is greater than 0° and smaller than ±1°). Forming a substrate or semiconductor layer which has a surface perfectly parallel to the m-plane is difficult in view of the manufacturing techniques. Thus, when an m-plane substrate or m-plane semiconductor layer is formed using the existing manufacturing techniques, a surface actually formed would inevitably be inclined from the ideal m-plane. The angle and azimuth of the inclination varies depending on the manufacturing process, and therefore, precisely controlling the inclination angle and inclination azimuth of the surface is difficult.

Note that the surface (principal surface) of the substrate or semiconductor is sometimes intentionally inclined from the m-plane by an angle of 1° or greater. In an embodiment described below, both the surface (principal surface) of a GaN substrate and the surface (principal surface) of a nitride semiconductor layer formed on the GaN substrate are intentionally inclined from the m-plane by an angle of 1° or greater.

(Other Embodiment)

In the present embodiment, a GaN substrate whose principal surface is inclined from the m-plane by an angle of 1° or greater (off-substrate) is used instead of the m-plane GaN substrate. In the present embodiment, a GaN substrate whose surface is inclined from the m-plane by an angle of 1° or greater is used instead of the GaN substrate 1 of FIG. 5 (or FIG. 8). Such a GaN substrate is commonly called "off-substrate". The off-substrate can be formed by performing the step of slicing off a substrate from a monocrystalline ingot and polishing the surface of the substrate such that the surface intentionally inclined in a specific azimuth from the m-plane is used as the principal surface. When the semiconductor multilayer structure 16 shown in FIG. 5 or FIG. 8 is formed on this GaN substrate, the surfaces (principal surfaces) of the respective layers are also inclined from the m-plane.

Figure 15:
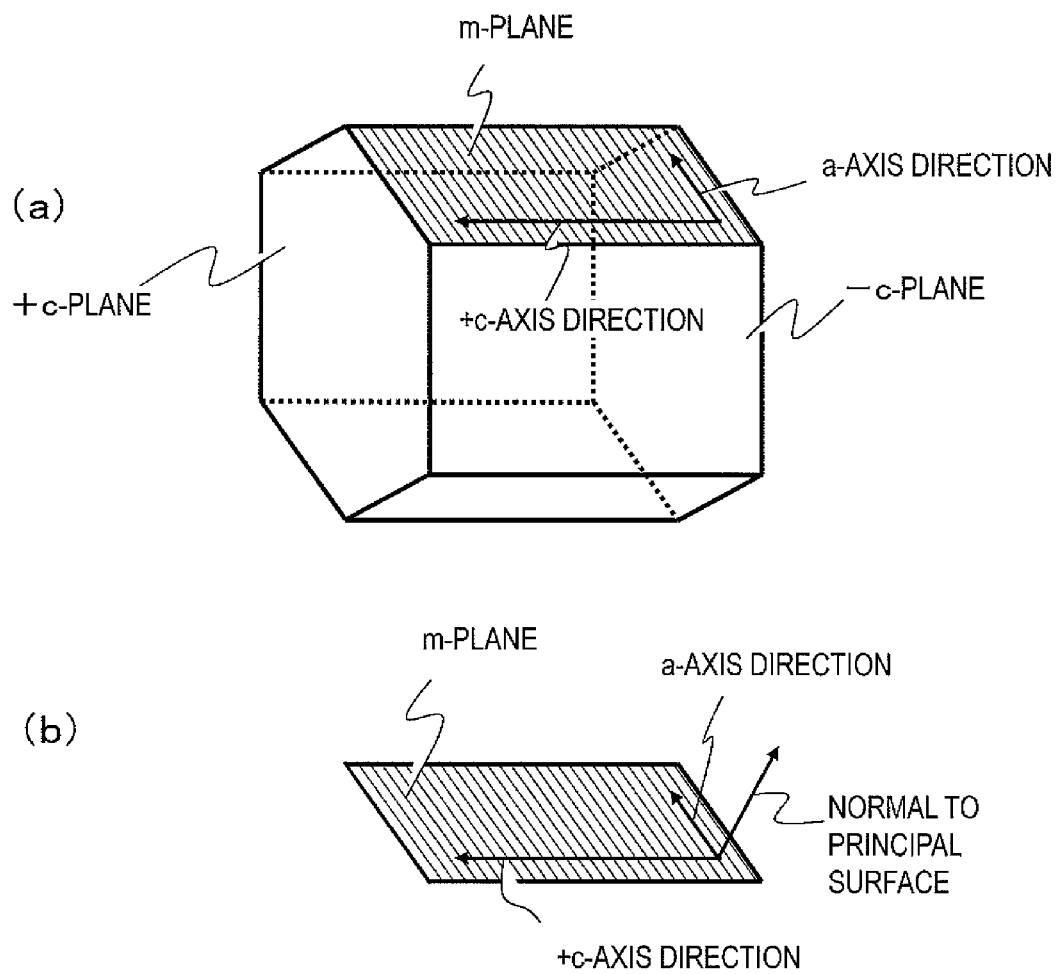
FIG. 15(a) schematically shows the crystalline structure (wurtzite crystal structure) of the GaN substrate.
FIG. 15(b) is a perspective view illustrating the relationship among the normal to the m-plane, the +c-axis direction, and the a-axis direction.

Next, details of the inclination of the GaN substrate in the present embodiment are described with reference to FIG. 15.

Figure 1:
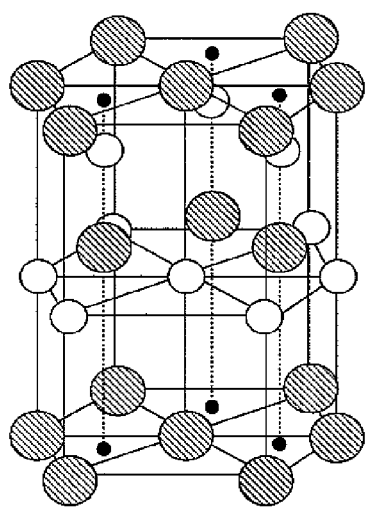
FIG. 1 is a perspective view schematically illustrating a unit cell of GaN.
Figure 1:
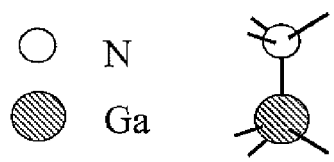
Figure 2:
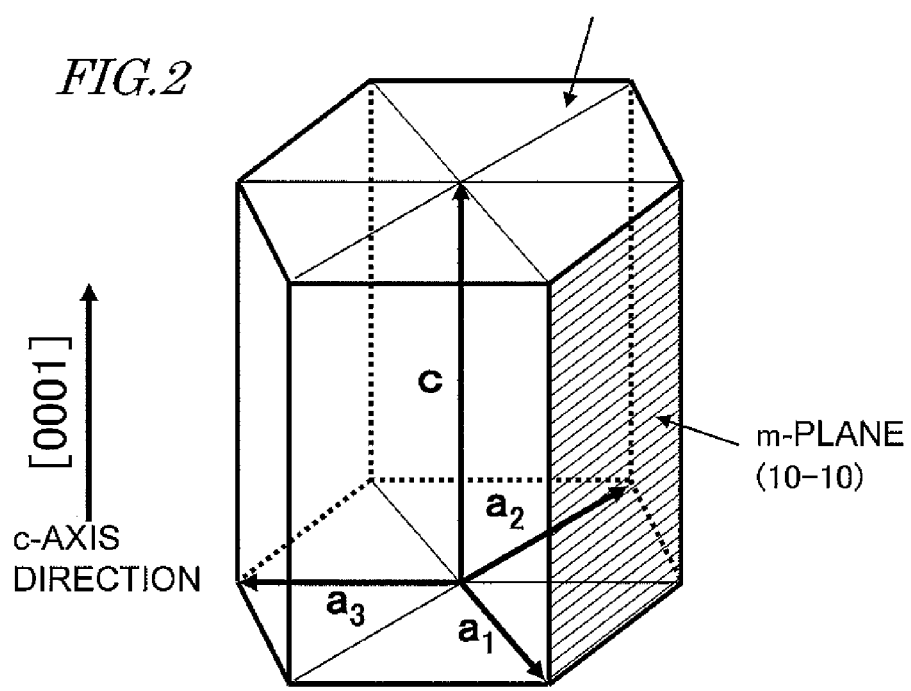
FIG. 2 is a perspective view showing primitive vectors $a_1$, $a_2$, $a_3$ and c representing a wurtzite crystal structure.
Figure 3:
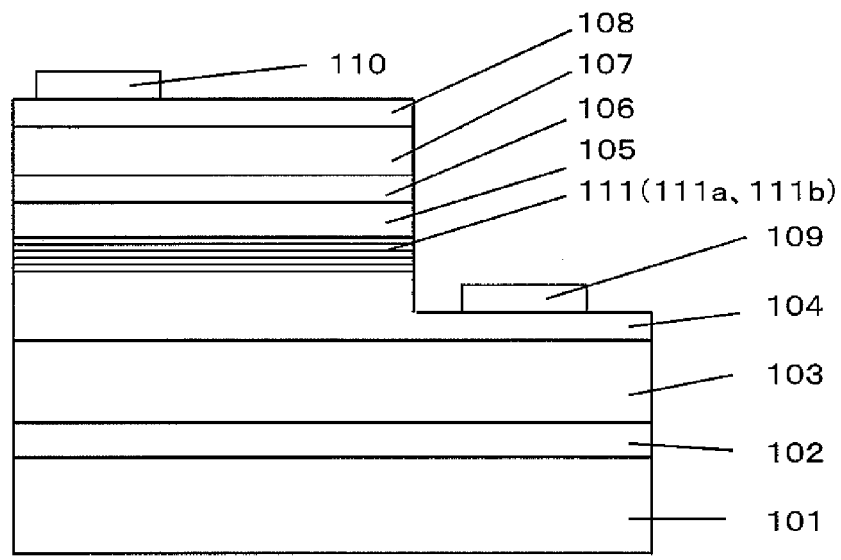
FIG. 3 is a cross-sectional view showing a structure of a nitride-based semiconductor light-emitting device disclosed in Patent Document 2.
Figure 4:
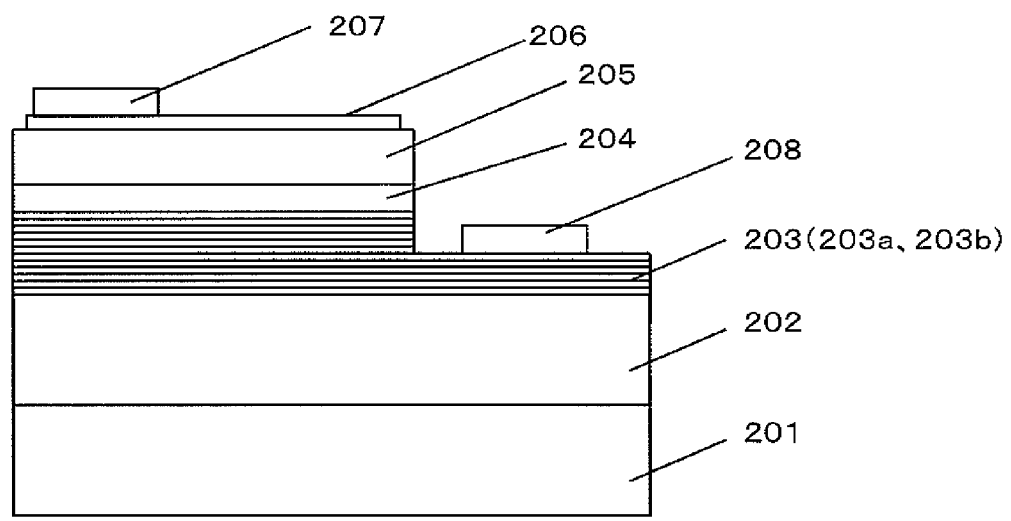
FIG. 4 is a cross-sectional view showing a structure of a nitride-based semiconductor light-emitting device disclosed in Patent Document 3.

FIG. 15(a) schematically shows the crystalline structure of the GaN substrate (wurtzite crystal structure), corresponding to 90° rotation of the crystalline structure of FIG. 2.

The c-planes of the GaN crystal include a +c-plane and a −c-plane. The +c-plane is a (0001) plane over which Ga atoms are exposed and is referred to as "Ga plane". On the other hand, the −c-plane is a (000-1) plane over which N (nitrogen) atoms are exposed and is referred to as "N plane". The +c-plane and the −c-plane are parallel to each other. Both of these planes are perpendicular to the m-plane. The c-planes have polarity and therefore can be classified into the +c-plane and the −c-plane. Classifying the a-plane that is a non-polar plane into the +a-plane and the −a-plane is nonsensical.

The +c-axis direction shown in FIG. 15(a) is a direction perpendicularly extending from the −c-plane to the +c-plane. On the other hand, the a-axis direction corresponds to the unit vector $a_2$ of FIG. 2 and is oriented in [−12-10] direction that is parallel to the m-plane. FIG. 15(b) is a perspective view illustrating the relationship among the normal to the m-plane, the +c-axis direction, and the a-axis direction. The normal to the m-plane is parallel to the [10-10] direction. As shown in FIG. 15(b), the normal to the m-plane is perpendicular to both the +c-axis direction and the a-axis direction.

The inclination of the principal surface of the GaN substrate from the m-plane by an angle of 1° or greater means that the normal to the principal surface of the GaN substrate is inclined from the normal to the m-plane by an angle of 1° or greater.

Figure 16:
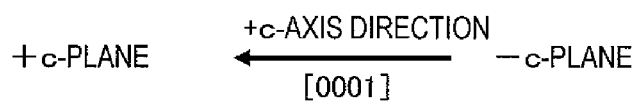
FIGS. 16(a) and 16(b) are cross-sectional views which illustrate the positional relationship between the principal surface of the GaN substrate and the m-plane.
Figure 16:
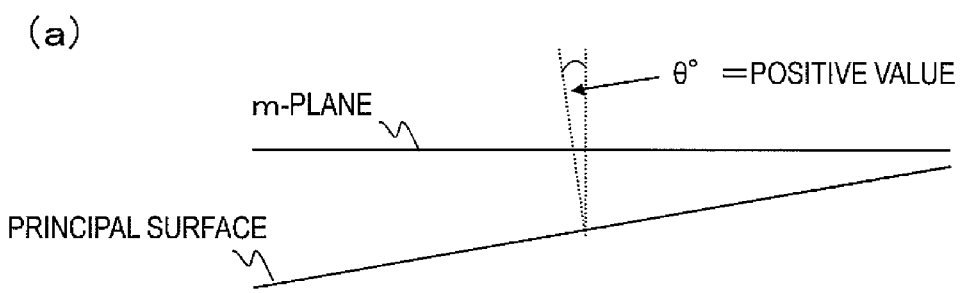
Figure 16:
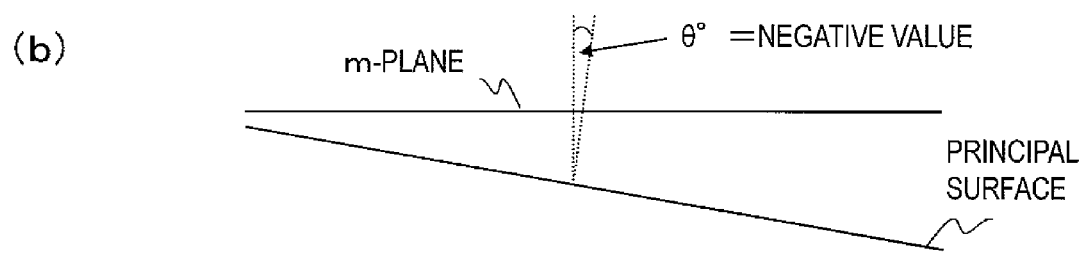

Next, refer to FIG. 16. FIGS. 16(a) and 16(b) are cross-sectional views which illustrate the relationship between the principal surface of the GaN substrate and the m-plane. These diagrams are cross-sectional views which are perpendicular to both the m-plane and the c-plane. In FIG. 16, an arrow which represents the +c-axis direction is shown. As shown in FIG. 15, the m-plane is parallel to the +c-axis direction. Therefore, a normal vector of the m-plane is perpendicular to the +c-axis direction.

In the examples shown in FIGS. 16(a) and 16(b), the normal vector of the principal surface of the GaN substrate is inclined in the c-axis direction from the normal vector of the m-plane. More specifically, in the example of FIG. 16(a), the normal vector of the principal surface is inclined toward the +c-plane side. In the example of FIG. 16(b), the normal vector of the principal surface is inclined toward the −c-plane side. In this specification, the inclination angle of the normal vector of the principal surface relative to the normal vector of the m-plane (inclination angle θ) in the former case is represented by a positive value, and the inclination angle θ in the latter case is represented by a negative value. In any of these cases, the statement that "the principal surface is inclined in the c-axis direction" holds true.

Figure 17:
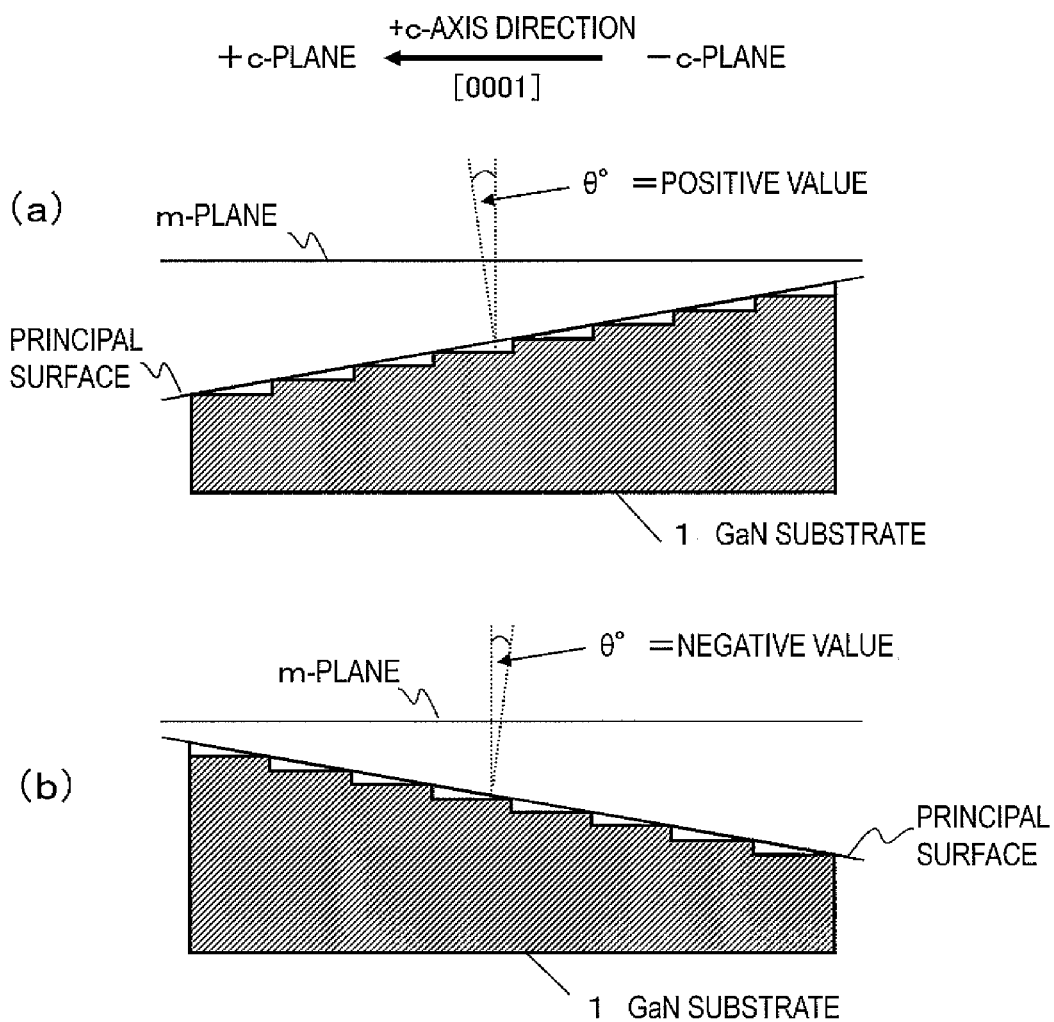
FIGS. 17(a) and 17(b) are cross-sectional views each schematically showing the principal surface of the GaN substrate 1 and its neighboring region.

In this embodiment, the inclination angle is in the range of 1° to 5° or in the range of −5° to −1°. In this case, the effects of the present invention can also be provided as well as in the case where the inclination angle is greater than 0° and smaller than ±1°. Hereinafter, the reasons for this are described with reference to FIG. 17. FIGS. 17(a) and 17(b) are cross-sectional views corresponding to FIGS. 16(a) and 16(b), respectively, showing a neighboring region of the principal surface in the GaN substrate 1 which is inclined in the c-axis direction from the m-plane. When the inclination angle θ is 5° or smaller, the principal surface of the GaN substrate 1 has a plurality of steps as shown in FIGS. 17(a) and 17(b). Each step has a height equivalent to a monoatomic layer (2.7 Å). The steps are parallel to each other with generally equal intervals (30 Å or more). With such an arrangement of the steps, it can be said that the principal surface of the GaN substrate 1 as a whole is inclined from the m-plane. However, upon closer observation, a large number of m-plane regions are exposed over the principal surface. The reason why the surface of the GaN substrate 1 whose principal surface is inclined from the m-plane has such a configuration is that the m-plane as a crystalline plane is intrinsically very stable.

When a GaN-based compound semiconductor layer is formed on the GaN substrate 1 of such a configuration, the principal surface of the GaN-based compound semiconductor layer has a similar shape to that of the principal surface of the GaN substrate 1. Specifically, the principal surface of the GaN-based compound semiconductor layer has a plurality of steps, and the principal surface of the GaN-based compound semiconductor layer as a whole is inclined from the m-plane.

It is inferred that basically the same phenomenon would occur even when the inclination direction of the normal vector of the principal surface is directed to a plane orientation different from the +c-plane and the −c-plane. When the normal vector of the principal surface is inclined in for example the a-axis direction, basically the same phenomenon occurs so long as the inclination angle is in the range of 1° to 5°.

The simulations whose results are shown in FIG. 10 to FIG. 13 were carried out on the assumption that the m-plane GaN layer (with an inclination from the m-plane being less than 1°) is used. However, as described above, it is estimated that, upon closer observation, a large number of m-plane regions are exposed over a plane whose inclination angle from the m-plane is not less than 1° and not more than 5°. Therefore, incorporation of an impurity, such as silicon or oxygen, occurs as well in the case of the m-plane. Thus, it is inferred that, even in the case of a GaN layer whose principal surface is inclined from the m-plane by an angle of not less than 1° and not more than 5°, the current can be diffused by the current diffusing layer 7 as well as in the case of the m-plane GaN layer.

As described above, in the photoluminescence measurement results shown in FIG. 14, the reason why the emission intensity of the YL of the m-plane GaN layer is low as compared with the c-plane GaN layer is probably the effect of bonds exposed at the surface. It is inferred that bonds exposed at the surface whose inclination angle from the m-plane is not less than 1° and not more than 5° do not have a great difference from bonds exposed at a surface whose inclination angle from the m-plane is less than 1°. Therefore, it is inferred that, even in the present embodiment, the current diffusing layer 7 and the semiconductor multilayer structure 16 formed thereon have high crystallinity.

Note that, when the absolute value of the inclination angle θ is greater than 5°, the internal quantum efficiency deteriorates due to a piezoelectric field. As such, if the piezoelectric field frequently occurs, realizing a semiconductor light-emitting device by means of m-plane growth has a small significance. Thus, according to the present invention, the absolute value of the inclination angle θ is limited to 5° or smaller. However, even when the inclination angle θ is set to for example 5°, the actual inclination angle θ may deviate from 5° by about ±1° due to variations in fabrication. Completely removing the variations in fabrication is difficult, while such a small angle deviation would not interrupt the effects of the present invention.

INVENTIVE EXAMPLE

Hereinafter, a nitride-based semiconductor light-emitting device fabricated on an m-plane n-type GaN substrate using a method of the present invention is described.

First, an m-plane n-type GaN substrate was placed in a MOCVD apparatus and subjected to a heat treatment at the substrate temperature of 850° C. for 10 minutes in a mixture gas atmosphere containing ammonium, hydrogen and nitrogen. The donor impurity concentration of the m-plane GaN substrate was $4\times10^{17}$ cm$^{-3}$.

Then, in an atmosphere containing ammonium, hydrogen, nitrogen, trimethylgallium, and silane, the substrate temperature was increased from 850° C. to 1090° C., whereby a heavily-doped n-type GaN layer was formed as the current diffusing layer. The proportion of the supplied Group V source material and the supplied Group III source material (V/III ratio) during the increase of the temperature was about 4600. The thickness of the current diffusing layer was about 100 nm. The donor impurity concentration of the current diffusing layer was about $1.7\times10^{19}$ cm$^{-3}$. After the substrate temperature reached 1090° C., the supply rate of trimethylgallium was increased, and crystal growth of a 2.0 µm thick n-type GaN layer was performed in a mixture gas atmosphere containing ammonium, hydrogen, nitrogen, trimethylgallium, and silane. The donor impurity concentration of the n-type nitride semiconductor layer was about $1.5\times10^{19}$ cm$^{-3}$. The V/III ratio during the crystal growth of the n-type nitride semiconductor layer was about 2300.

Then, the growth temperature was decreased to 780° C., and an active layer including a 9 nm thick InGaN active layer and a 15 nm thick GaN barrier layer was formed. During the decrease of the temperature, the supply of the Group III source material was interrupted. The In source material used was trimethylindium. The emission wavelength of the active layer was about 470 nm.

Then, in an atmosphere containing ammonium, hydrogen, nitrogen, and trimethylgallium, the growth temperature was increased to 995° C. The thickness of an undoped GaN layer which was formed by crystal growth during the increase of the temperature was about 80 nm according to the calculation. Then, a 5 nm thick p-type GaN layer, a 20 nm thick p-type AlGaN layer, and a 500 nm thick p-type GaN layer were sequentially formed by crystal growth as a p-type nitride semiconductor layer. The acceptor impurity used was Mg. The Al mole fraction of the p-type AlGaN layer was about 15%.

Then, part of the n-type nitride semiconductor layer was exposed using a dry etching apparatus with a chlorine gas. Thereafter, at the part where the n-type nitride semiconductor layer was exposed, an n-electrode was formed of Ti and Al. Meanwhile, on the upper surface of the p-type nitride semiconductor layer, a p-electrode is formed of Pd and Pt.

Next, on the surfaces of the n-electrode and the p-electrode, 1 µm thick Au pads were formed.

Then, the m-plane n-type GaN substrate was polished at the rear surface till its thickness decreased to 100 µm. Thereafter, the resultant structure was diced into chips, each of which had a square shaped top surface of 800 µm on each side.

In the last, the resultant structure was flip-chip mounted to a ceramic mounting base made of alumina, whereby a nitride-based semiconductor light-emitting device was fabricated.

Three samples of such a nitride-based semiconductor light-emitting device (Inventive Example) were prepared, and their electrical characteristics were examined. For the sake of comparison, three samples of a nitride-based semiconductor light-emitting device which does not have a current diffusing layer (Comparative Example) were prepared using the same fabrication method.

Figure 18:
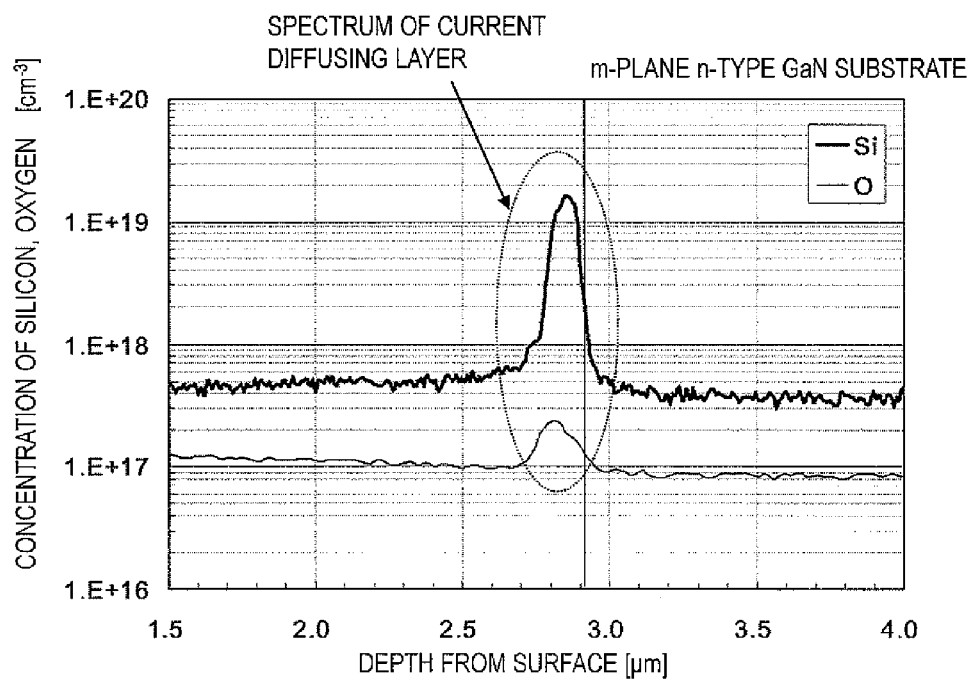
FIG. 18 is a graph showing the results of measurement of the concentration of silicon and oxygen in a nitride-based semiconductor light-emitting device of Inventive Example by SIMS analysis.

FIG. 18 is a graph showing the results of measurement of the concentration of silicon and oxygen in the nitride-based semiconductor light-emitting device of Inventive Example by SIMS analysis. In the graph of FIG. 18, the shallow side relative to the peak that is indicative of the current diffusing layer is a region corresponding to the n-type nitride semiconductor layer. In this graph, the donor impurity concentration of the n-type nitride semiconductor layer exhibits a value which is not more than $1.0\times10^{18}$ cm$^{-3}$. On the other hand, the donor impurity concentration of the current diffusing layer is higher than $1.0\times10^{19}$ cm$^{-3}$. From this result, it is seen that the donor impurity concentration of the current diffusing layer is ten times the donor impurity concentration of the n-type nitride semiconductor layer 2.

From this SIMS result, the current diffusing layer is a layer whose thickness and impurity concentration are controllable in contrast to a pile-up layer which is unintentionally formed at the interface between the substrate and the nitride semiconductor.

In the graph of FIG. 18, a region corresponding to the electron diffusing layer also has a high oxygen concentration.

This is attributed to the fact that, when the m-plane GaN layer is formed at a low temperature, the impurity is readily incorporated.

Figure 19:
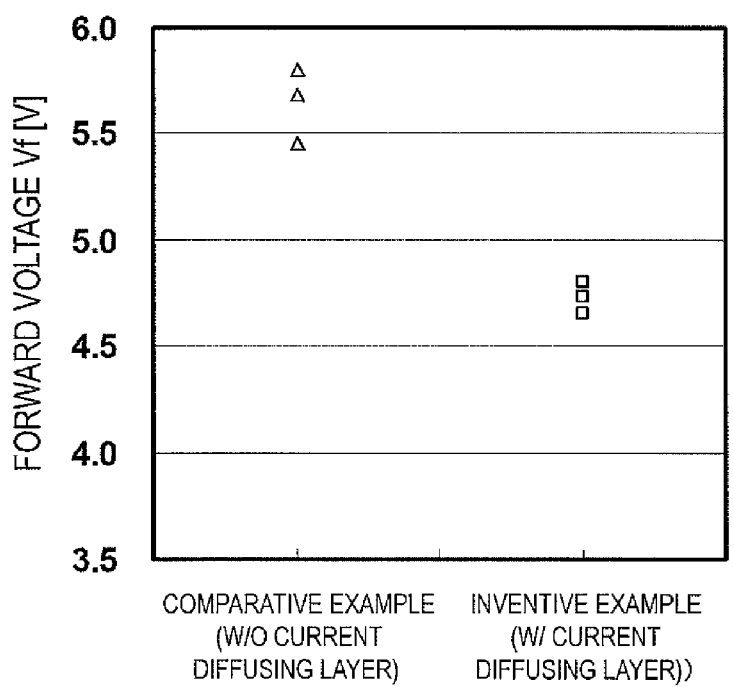
FIG. 19 is a graph showing the results of measurement of the forward voltage (Vf) of nitride-based semiconductor light-emitting devices of Inventive Example and Comparative Example.

FIG. 19 is a graph showing the results of measurement of the forward voltage (Vf) of the nitride-based semiconductor light-emitting devices of Inventive Example and Comparative Example. The forward voltage (Vf) was a voltage value which reached 10 mA. As shown in FIG. 19, in the device of Inventive Example which includes the current diffusing layer, Vf is lower by about 1 V than in the device of Comparative Example which does not include the current diffusing layer.

In the simulation results shown in FIG. 12, under the same conditions as those of the nitride semiconductor device of Inventive Example (the thickness of the current diffusing layer is 100 nm, and the donor impurity concentration is $1.0 \times 10^{19}$ cm$^{-3}$), the forward voltage (Vf) is lower by about 0.05 V in the device that includes the current diffusing layer than in the device that does not include the current diffusing layer. On the other hand, according to Inventive Example, Vf is lower by about 1 V in the device that includes the current diffusing layer than in the device that does not include the current diffusing layer. The reason why the effect of Inventive Example is larger than the simulation result is thought to be that it depends on the size of the device. The device of the simulation had a square shaped top surface of 300 μm on each side, whereas the devices of Inventive Example and Comparative Example had a square shaped top surface of 800 μm on each side. Thus, the device size of Inventive Example and Comparative Example was two or more times that of the simulation device, and the area was 6 or more times that of the simulation device. Concentration of the current occurs more readily in the 800 μm size devices than in the 300 μm size device. This is thought to be the reason that the effect of decreasing the forward voltage (Vf) was remarkably produced. This means that, as the device size of the nitride-based semiconductor light-emitting device increases (e.g., a cube of 800 μm on each side or greater), the effect of the present invention becomes greater.

Figure 20:
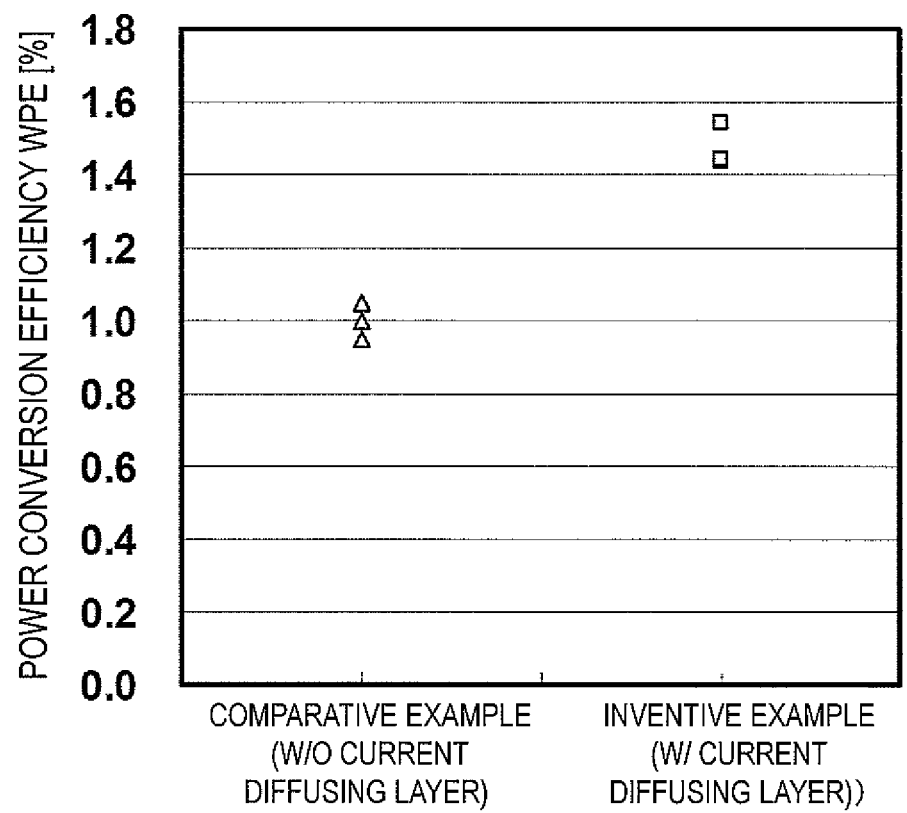
FIG. 20 is a graph showing the results of measurement of the power conversion efficiency (WPE: Wall-Plug Efficiency) of the nitride-based semiconductor light-emitting devices of Inventive Example and Comparative Example.

FIG. 20 is a graph showing the results of measurement of the power conversion efficiency (WPE) of Inventive Example and Comparative Example. The power conversion efficiency (WPE) is a value which was measured when the current value was 10 mA. The reason why the WPE in the graph of FIG. 20 is greatly different from the simulation results shown in FIG. 13 is thought to be that the devices of Inventive Example and Comparative Example are not covered with a resin, for example, so that the light extraction efficiency is insufficient and, in addition, the reflectance of the electrodes is insufficient. As shown in FIG. 20, in the device of Inventive Example which includes the current diffusing layer, the WPE exhibited an improvement of about 0.5% as compared with the device of Comparative Example which does not include the current diffusing layer.

INDUSTRIAL APPLICABILITY

The present invention is useful as devices of which reduction of power consumption is demanded, such as a lighting device, a backlight of a liquid crystal display, etc.

REFERENCE SIGNS LIST 1 n-type GaN substrate (or GaN layer) with m-plane principal surface
2 n-type nitride semiconductor layer
3 active layer
4 p-type nitride semiconductor layer
5 p-electrode
6 n-electrode
7 current diffusing layer
8 AlGaN layer
9 pad electrode
10 mounting base
11 interconnection wire
12 Au wire
13 reflector film
14 Au bump
15 conductive supporting substrate
16 nitride semiconductor layer
31 nitride-based semiconductor light-emitting device
32 nitride-based semiconductor light-emitting device
101 substrate
102 buffer layer
103 n-type GaN underlayer
104 n-type contact layer
105 active layer
106 p-type cladding layer
107 p-type contact layer
108 transparent electrode
109 n-side pad electrode
110 p-side pad electrode
111 multi-film nitride semiconductor layer
111a first nitride semiconductor layer
111b second nitride semiconductor layer
201 substrate
202 buffer layer
203 n-type nitride semiconductor layer
203a n-type GaN layer
203b un-GaN layer
204 active layer
205 p-type nitride semiconductor layer
206 p-electrode
207 p-side bonding pad
208 n-electrode

The invention claimed is:

1. A nitride-based semiconductor light-emitting device, comprising:
    an n-type GaN substrate which has an m-plane principal surface;
    a current diffusing layer provided on the n-type GaN substrate, the current diffusing layer being in contact with the n-type GaN substrate;
    an n-type nitride semiconductor layer provided directly or indirectly on the current diffusing layer;
    an active layer provided directly or indirectly on the n-type nitride semiconductor layer;
    a p-type nitride semiconductor layer provided directly or indirectly on the active layer;
    a p-electrode which is in contact with the p-type nitride semiconductor layer; and
    an n-electrode which is in contact with the n-type GaN substrate or the n-type nitride semiconductor layer,
    wherein
    a donor impurity concentration of the n-type nitride semiconductor layer is not more than $5 \times 10^{18}$ cm$^{-3}$, and
    a donor impurity concentration of the current diffusing layer is ten or more times the donor impurity concentration of the n-type nitride semiconductor layer.

2. The nitride-based semiconductor light-emitting device of claim 1, wherein the donor impurity concentration of the current diffusing layer is ten or more times a donor impurity concentration of the n-type GaN substrate.

3. The nitride-based semiconductor light-emitting device of claim 1, wherein the donor impurity concentration of the current diffusing layer is not less than $5 \times 10^{18}$ cm$^{-3}$ and not more than $5 \times 10^{19}$ cm$^{-3}$.

4. The nitride-based semiconductor light-emitting device of claim 2, wherein the donor impurity concentration of the n-type GaN substrate is not more than $5 \times 10^{18}$ cm$^{-3}$.

5. The nitride-based semiconductor light-emitting device of claim 1, wherein a thickness of the current diffusing layer is not less than 25 nm and not more than 2 μm.

6. The nitride-based semiconductor light-emitting device of claim 1, wherein a donor impurity of the current diffusing layer is silicon.

7. The nitride-based semiconductor light-emitting device of claim 6, wherein the current diffusing layer is further doped with oxygen as an additional donor impurity.

8. The nitride-based semiconductor light-emitting device of claim 1, wherein the donor impurity concentration of the current diffusing layer is not less than $1 \times 10^{19}$ cm$^{-3}$.

9. The nitride-based semiconductor light-emitting device of claim 1, wherein
part of a semiconductor multilayer structure which is formed by the current diffusing layer, the n-type nitride semiconductor layer, the active layer, and the p-type nitride semiconductor layer has a recessed portion, and
the p-type nitride semiconductor layer and the active layer are exposed at a lateral surface of the recessed portion, the n-type nitride semiconductor layer is exposed at an upper surface of the recessed portion, and the n-electrode is provided on the n-type nitride semiconductor layer.

10. The nitride-based semiconductor light-emitting device of claim 2, wherein
the n-electrode is provided on a surface of the n-type GaN substrate opposite to the other surface that is in contact with the current diffusing layer.

11. The nitride-based semiconductor light-emitting device of claim 5, wherein the thickness of the current diffusing layer is not less than 25 nm and not more than 400 nm.

12. A nitride-based semiconductor light-emitting device, comprising:
an n-type GaN substrate;
a current diffusing layer provided on the n-type GaN substrate, the current diffusing layer being in contact with the n-type GaN substrate;
an n-type nitride semiconductor layer provided directly or indirectly on the current diffusing layer;
an active layer provided directly or indirectly on the n-type nitride semiconductor layer;
a p-type nitride semiconductor layer provided directly or indirectly on the active layer;
a p-electrode which is in contact with the p-type nitride semiconductor layer; and
an n-electrode which is in contact with the n-type GaN substrate or the n-type nitride semiconductor layer, wherein
a donor impurity concentration of the n-type nitride semiconductor layer is not more than $5 \times 10^{18}$ cm$^{-3}$,
a donor impurity concentration of the current diffusing layer is ten or more times the donor impurity concentration of the n-type nitride semiconductor layer, and
an angle between a normal to a principal surface of the n-type GaN substrate and a normal to an m-plane is not less than 1° and not more than 5°.

13. The nitride-based semiconductor light-emitting device of claim 12, wherein the n-type GaN substrate is a semiconductor layer which is inclined in a c-axis direction or an a-axis direction.

14. The nitride-based semiconductor light-emitting device of claim 1, wherein the current diffusing layer is formed by increasing a substrate temperature while supplying a source gas.

15. The nitride-based semiconductor light-emitting device of claim 12, wherein the current diffusing layer is formed by increasing a substrate temperature while supplying a source gas.

16. The nitride-based semiconductor light-emitting device of claim 12, wherein the donor impurity concentration of the current diffusing layer is ten or more times a donor impurity concentration of the n-type GaN substrate.

17. The nitride-based semiconductor light-emitting device of claim 12, wherein the donor impurity concentration of the current diffusing layer is not less than $5 \times 10^{18}$ cm$^{-3}$ and not more than $5 \times 10^{19}$ cm$^{-3}$.

18. The nitride-based semiconductor light-emitting device of claim 16, wherein the donor impurity concentration of the n-type GaN substrate is not more than $5 \times 10^{18}$ cm$^{-3}$.

19. The nitride-based semiconductor light-emitting device of claim 12, wherein a thickness of the current diffusing layer is not less than 25 nm and not more than 2 μm.

20. The nitride-based semiconductor light-emitting device of claim 12, wherein a donor impurity of the current diffusing layer is silicon.

21. The nitride-based semiconductor light-emitting device of claim 20, wherein the current diffusing layer is further doped with oxygen as an additional donor impurity.

22. The nitride-based semiconductor light-emitting device of claim 12, wherein the donor impurity concentration of the current diffusing layer is not less than $1 \times 10^{19}$ cm$^{-3}$.

23. The nitride-based semiconductor light-emitting device of claim 12, wherein
part of a semiconductor multilayer structure which is formed by the current diffusing layer, the n-type nitride semiconductor layer, the active layer, and the p-type nitride semiconductor layer has a recessed portion, and
the p-type nitride semiconductor layer and the active layer are exposed at a lateral surface of the recessed portion, the n-type nitride semiconductor layer is exposed at an upper surface of the recessed portion, and the n-electrode is provided on the n-type nitride semiconductor layer.

24. The nitride-based semiconductor light-emitting device of claim 16, wherein
the n-electrode is provided on a surface of the n-type GaN substrate opposite to the other surface that is in contact with the current diffusing layer.

25. The nitride-based semiconductor light-emitting device of claim 19, wherein the thickness of the current diffusing layer is not less than 25 nm and not more than 400 nm.

* * * * *